(12) United States Patent
Kirby et al.

(10) Patent No.: US 7,547,850 B2
(45) Date of Patent: Jun. 16, 2009

(54) SEMICONDUCTOR DEVICE ASSEMBLIES WITH COMPLIANT SPRING CONTACT STRUCTURES

(75) Inventors: Kyle K. Kirby, Boise, ID (US); Warren M. Farnworth, Nampa, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 11/476,471

(22) Filed: Jun. 28, 2006

(65) Prior Publication Data
US 2006/0243483 A1 Nov. 2, 2006

Related U.S. Application Data

(62) Division of application No. 10/871,153, filed on Jun. 18, 2004.

(51) Int. Cl.
*H05K 1/16* (2006.01)
(52) U.S. Cl. .................. 174/260; 174/351; 361/760; 361/772; 361/778
(58) Field of Classification Search .......... 361/760, 361/748, 752, 728, 807; 174/260, 351
See application file for complete search history.

(56) References Cited

U.S. PATENT DOCUMENTS

| | | | |
|---|---|---|---|
| 3,842,189 A | 10/1974 | Southgate | |
| 5,166,774 A | 11/1992 | Banerji et al. | |
| 5,280,139 A | 1/1994 | Suppelsa et al. | |
| 5,848,685 A | 12/1998 | Smith et al. | |
| 6,184,065 B1 * | 2/2001 | Smith et al. | 438/117 |
| 6,229,684 B1 * | 5/2001 | Cowen et al. | 361/278 |
| 6,651,325 B2 | 11/2003 | Lee et al. | |
| 6,658,728 B2 | 12/2003 | Fork et al. | |
| 6,827,584 B2 | 12/2004 | Mathieu et al. | |
| 6,973,722 B2 | 12/2005 | Hantschel et al. | |
| 7,019,221 B1 | 3/2006 | Noda | |
| 7,048,548 B2 | 5/2006 | Mathieu et al. | |

(Continued)

OTHER PUBLICATIONS

Linder, "Nanosprings—New Dimensions in Sputtering", Advanced Packaging, http://semiconductors.unaxis.com/en/p22_47_nanosprings.pdf, pp. 44-47.

(Continued)

*Primary Examiner*—Jeremy C Norris
*Assistant Examiner*—Yuriy Semenenko
(74) *Attorney, Agent, or Firm*—TraskBritt

(57) ABSTRACT

Photolithography patterned spring contacts are disclosed. The spring contacts may be fabricated using thin film processing techniques. A substrate, such as a silicon wafer or a carrier substrate is provided. At least one layer of a metal or alloy film may be deposited on the substrate or on at least one intervening release layer and patterned to form metal traces. A stressable material, exhibiting an at least partially tensile stress state, may be deposited on the metal traces in a localized region. A portion of the substrate or a portion of the intervening release layer underneath the metal traces may be removed by etching, causing the metal traces to curl upward resulting in the spring contacts. The spring contacts may be used as compliant electrical contacts for electrical devices, such as integrated circuits or carrier substrates. The compliant electrical contacts may also be used for probe cards to test other electrical devices.

62 Claims, 19 Drawing Sheets

U.S. PATENT DOCUMENTS

| | | |
|---|---|---|
| 7,127,811 B2 | 10/2006 | Mathieu et al. |
| 7,325,302 B2 | 2/2008 | Mathieu et al. |
| 2002/0173146 A1* | 11/2002 | Fork |
| 2003/0099097 A1 | 5/2003 | Mok et al. |
| 2003/0100145 A1 | 5/2003 | Fork |
| 2003/0103338 A1 | 6/2003 | Vandentop et al. |
| 2003/0155940 A1 | 8/2003 | Lee et al. |
| 2008/0115353 A1 | 5/2008 | Mathieu et al. |

OTHER PUBLICATIONS

"Tips for Scanning Probe Microscopes", PARC Research, http://www.parc.com/research/eml/projects/stressedmetal/probes/default.html, Sep. 26, 2003, 3 pages.

"Cost Effective Electrical Connections for Advanced ICs", NanoNexus, http://www.nanonexus.com/pages/products.php? . . . /spresults.aspx?q=nanospring&FORM=1E, Sep. 26, 2003, 2 pages.

* cited by examiner

US 7,547,850 B2

SEMICONDUCTOR DEVICE ASSEMBLIES WITH COMPLIANT SPRING CONTACT STRUCTURES

CROSS-REFERENCE TO RELATED APPLICATION

This application is a divisional of application Ser. No. 10/871,153, filed Jun. 18, 2004, pending.

BACKGROUND OF THE INVENTION

1. Field of the Invention

The present invention relates to compliant spring contacts fabricated using photolithographic techniques. More specifically, the present invention relates to compliant spring contacts which may be used in electrically connecting integrated circuits to another external electrical device.

2. State of the Art

Semiconductor devices including integrated circuitry, such as memory dice, are mass produced by fabricating hundreds or even thousands of identical circuit patterns on a single semiconductor wafer or other bulk semiconductor substrate using photolithography in combination with various other material deposition and removal processes. These semiconductor devices are subsequently electrically connected to other electrical components, such as additional semiconductor devices, printed circuit boards (PCBs), and probe cards, among many others.

Electrical contact structures are an integral part of connecting semiconductor devices to external electrical components, such as other semiconductor devices, PCBs, probe cards, etc. There are several standard bonding methods known in the art for electrically connecting semiconductor devices to another electrical device. Some of these methods, as illustrated in FIG. 9, include wire bonding, tab bonding, solder-bump bonding, and flip-chip bonding, among many other methods. Referring to FIG. 9, a semiconductor chip 28a having a ball grid array 30 is flip-chip bonded to a printed circuit board (PCB) 32. Semiconductor chip 28b is bonded to PCB 32 using an adhesive 40 and in electrical communication with PCB 32 using wire bonds 38. Tab bonding is illustrated with semiconductor chip 28c bonded to PCB 32 using an adhesive 40 and in electrical communication with PCB 32 using tape leads 36. While the above methods have adequately worked in the past, the trend in semiconductor devices is to use smaller and smaller electrical contacts to accommodate the greater number of circuits on the substrates which pose difficulties for the above mentioned conventional bonding methods.

An example of fine pitch electrical contacts is described in U.S. Pat. No. 5,848,685 to Smith et al. ("the Smith Patent") entitled "Photolithographically Patterned Spring Contact" the disclosure of which is herein incorporated by reference and the article in *Advanced Packaging*, Linder at al., "Nanosprings—New Dimensions in Sputtering," pp.44-47. The above references disclose photolithographically patterned spring contacts that may be used for flip-chip contacts or for probe card applications. FIG. 10 is a side view of such a spring contact. Bonding structure 100 includes a plurality of spring contacts 34. Each spring contact 34 comprises a free, cantilevered portion 42 and an anchor portion 46 fixed to an insulating underlayer 48 made from silicon nitride or other etchable insulating material and electrically connected to a contact pad 50. Each spring contact 34 is made of an extremely elastic material, such as a chrome-molybdenum alloy or a nickel-zirconium alloy. The contact pad 50 is the terminal end of a line or trace which electrically communicates between an electronic device formed on the substrate 44 or device 101 such as a transistor, a display electrode, or other electrical device. However, while the patterned spring contacts of the Smith Patent may be used to create a fine array of spring contacts connectable to an external device, it suffers from several deficiencies.

First, Smith discloses using extremely elastic materials for the spring contacts. Examples of extremely elastic materials disclosed in Smith are chrome-molybdenum alloys or nickel-zirconium alloys, both of which are poor electrical conductors compared to traditional electrical contact materials made predominately from copper or aluminum. Second, the entire spring contact is formed from the stressable material. Third, stresses from the films used are not localized. Instead, the entire film used for the spring contact is under stress. Finally, in practice, when the spring contacts of Smith are soldered to contact pads, the entire spring contact becomes covered with an excessive amount of solder material, resulting in a lack of flexibility of the spring contact, preventing the spring contact from deflecting toward the substrate. This results in fracture of the spring contact when loaded.

Accordingly, in order to improve the performance of spring contacts, a need exists for a conductive spring contact in which conventional thin film fabrication techniques may be used. A need also exists to create a localized stressed region in the thin films. Furthermore, a spring contact is needed which is durable when loaded.

BRIEF SUMMARY OF THE INVENTION

The present invention, in a number of embodiments, includes compliant spring contacts, methods of fabricating the compliant spring contacts, and methods of utilizing the compliant spring contacts as electrical contacts for various applications. The compliant spring contacts of the present invention may be used as electrical contacts in semiconductor device applications, such as flip-chip bonding of semiconductor chips to another electrical device, probe cards, and many other applications that require a fine array of electrical contacts.

In one aspect of the present invention, an electrical device employing a plurality of compliant electrical contacts is disclosed. A substrate having a plurality of compliant electrical contacts, each comprising a conductive trace, may be disposed on the substrate or on at least one intervening release layer, the conductive traces having a free, cantilevered portion and a portion fixed to the substrate or the at least one intervening release layer. Each conductive trace may have bonded thereto at least one stressed material having a length less than the length of the conductive trace and exhibiting an at least partially tensile stress state that biases the free, cantilevered portion away from the substrate forming a resilient nano-spring. By only having the stressed material cover a portion of the length of the conductive trace, the electrical conductivity of the compliant electrical contact is not substantially degraded. Furthermore, the resulting stresses in the conductive trace are localized, thereby preventing the conductive traces from delaminating from the underlying substrate. The compliant electrical contacts may form the electrical contacts for externally connecting various circuit elements contained on or within the substrate to other electrical devices, such as PCBs or semiconductor devices.

In another aspect of the present invention, a method for forming an electrical device including a plurality of compliant electrical contacts is disclosed. At least one conductive layer may be deposited on the substrate or on at least one intervening release layer. A plurality of traces may then be formed from the conductive layer. A stressed material exhibiting an at least partially tensile stress state may be formed on a selected portion of each of the traces. A portion of the substrate or the release layer may be removed from underneath a portion of each of the traces, permitting the tensile stresses in the stressed material to bias a free, cantilevered portion of each trace away from the substrate to form a compliant electrical contact.

In another aspect of the present invention, a semiconductor assembly is disclosed. A carrier substrate (e.g., a printed circuit board) having a plurality of compliant electrical contacts in accordance with the present invention may be electrically connected to corresponding bond pads on the active surface of at least one semiconductor die.

In another aspect of the present invention, a semiconductor assembly is disclosed. A semiconductor substrate (e.g., a semiconductor die), having a plurality of compliant electrical contacts in accordance with the present invention, may be electrically connected to corresponding terminal pads on a surface of a carrier substrate (e.g., a printed circuit board).

In another aspect of the present invention, a probe card is disclosed. The probe card includes a plurality of compliant electrical contacts of the present invention. The compliant electrical contacts of the probe card may be temporarily electrically connected with corresponding bond pads on the active surface of a semiconductor substrate such as, for example, a semiconductor wafer or die.

In yet another aspect of the present invention, a method of testing an electrical device, such as a semiconductor device, using a probe card is disclosed. A probe card having a plurality of compliant electrical contacts of the present invention is provided. The compliant electrical contacts may be temporarily electrically connected to at least one bond pad of the external electrical device which is coupled to circuitry thereof. The compliant electrical contacts may also contact all of the bond pads of the external electrical device to test all of the circuitry of the external electrical device at substantially the same time, thus eliminating the need to test the circuitry in sections.

These features, advantages, and alternative aspects of the present invention will be apparent to those skilled in the art from a consideration of the following detailed description taken in combination with the accompanying drawings.

BRIEF DESCRIPTION OF THE SEVERAL VIEWS OF THE DRAWINGS

In the drawings, which illustrate what is currently considered to be the best mode for carrying out the invention.

DETAILED DESCRIPTION OF THE INVENTION

The present invention, in a number of embodiments, includes compliant spring contacts, methods of manufacturing the compliant spring contacts, and methods of utilizing the compliant spring contacts as electrical contacts for various applications. The compliant spring contacts of the present invention may be used as electrical contacts in flip-chip bonding of semiconductor devices to another electrical device, probe cards, and many other applications that require a fine array of electrical contacts.

Figure 1A:
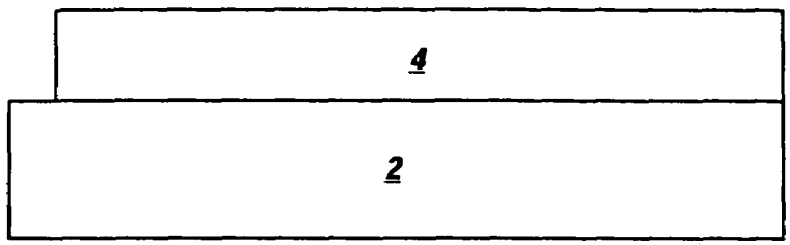
FIGS. 1A-1F illustrate a method of making an exemplary compliant spring contact according to the present invention and the resulting structure.

An exemplary embodiment for forming compliant spring contacts of the present invention is shown in FIGS. 1A-1F. Referring to FIG. 1A, a substrate 2 is provided having an optional release layer 4 deposited thereon. Substrate 2 may be formed from a semiconductor material such as, for example, single crystal silicon, single crystal gallium arsenide, polysilicon, indium phosphide, a layered bulk semiconductor substrate (such as a silicon on insulator (SOI) substrate as exemplified by a silicon on glass (SOG) or silicon on sapphire (SOS) substrate), or any other suitable material. Substrate 2 may also comprise a carrier substrate formed, for example, of BT resin or comprising an FR-4 or FR-5 laminate, a ceramic substrate, a silicon substrate, a flexible circuit board, or any other type of rigid or flexible circuit board material known to one of ordinary skill in the art. Optional release layer 4 may be an oxide or nitride such as, for example, silicon dioxide or silicon nitride formed by chemical vapor deposition (CVD), atomic layer deposition (ALD), reactive sputtering, or another suitable technique. Release layer 4 may also be formed from a variety of polymeric materials such as, for example, a polyimide processed by spinning a film onto the substrate 2, screen printing, or applying a preformed polyimide tape.

Figure 1B:
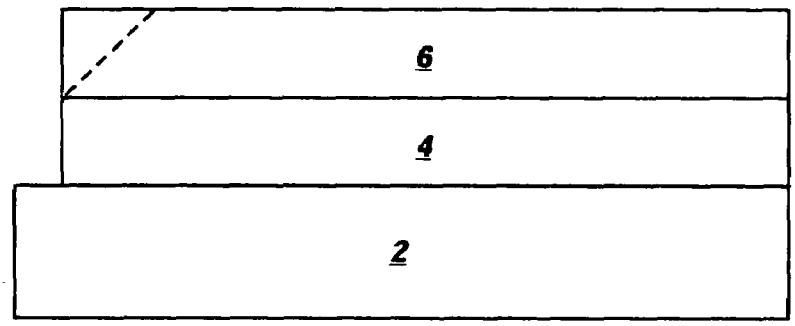
Figure 1C:
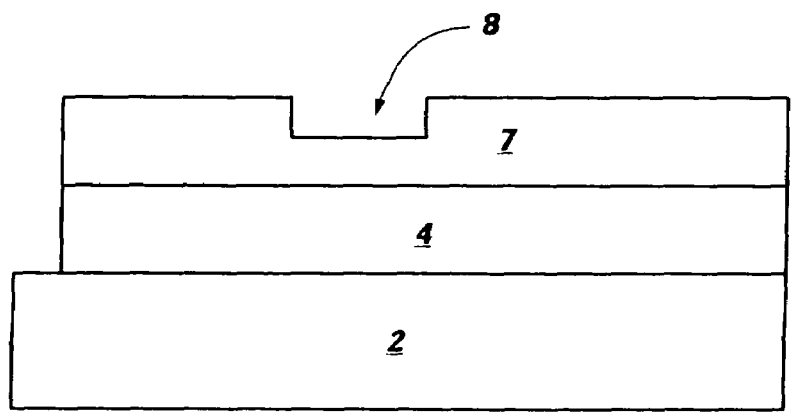

As shown in FIG. 1B, a metal film 6, which will be used to form a spring contact, is deposited on release layer 4 using evaporation, sputtering, CVD, or another suitable technique. Metal film 6 may be formed from, for example, aluminum, copper, or alloys thereof. The deposition of metal film 6 may be effected at a temperature below 100° C. to minimize diffusion of metals into substrate 2 or release layer 4. Metal film 6 may be subsequently patterned and etched using conventional photolithography techniques common to semiconductor device fabrication to form a plurality of metal traces 7. Metal traces 7 may form the external electrical contacts for a semiconductor die or dice, circuit boards, or the electrical contacts of a probe card for testing semiconductor devices. Metal traces 7 may also be bonded directly to the bond pads of circuitry contained on or within substrate 2 to form the external electrical contacts for such devices. If desired, when forming metal traces 7, metal film 6 may be patterned and subsequently etched using conventional photolithography techniques to have a sharpened tip, as shown by the dashed line in FIG. 1B, to provide metal traces 7 with a tip with a small contact area for applications requiring a precision tip or to aid in breaking through surface oxide on bond pads contacted by the metal traces 7 to effect a reliable electrical connection therewith. To facilitate soldering the spring contacts to corresponding bond or terminal pads on another electrical device, the tips of each of the metal traces 7 may be coated with a solder wettable material such as, for example, gold, silver, copper, nickel, alloys thereof, or any other metal or alloy that will allow typical lead or tin solders to wet it. The tips of each of the metal traces 7 may be coated with a solder wettable material by depositing a layer of one of the above metals or alloys on the upper surface of metal film 6 by CVD, evaporation, sputtering, electroplating, electroless plating, or another suitable technique, followed by photolithographically patterning and etching to leave only a small amount of the solder wettable material covering a portion of metal film 6 that will form at least part of the tip of metal trace 7. Once the tip is coated with the solder wettable material, the metal traces 7 may be formed as described above. Referring to FIG. 1C, metal traces 7 may again be patterned and etched to form aperture 8 using photolithography methods known to those of ordinary skill in the art.

Figure 1D:
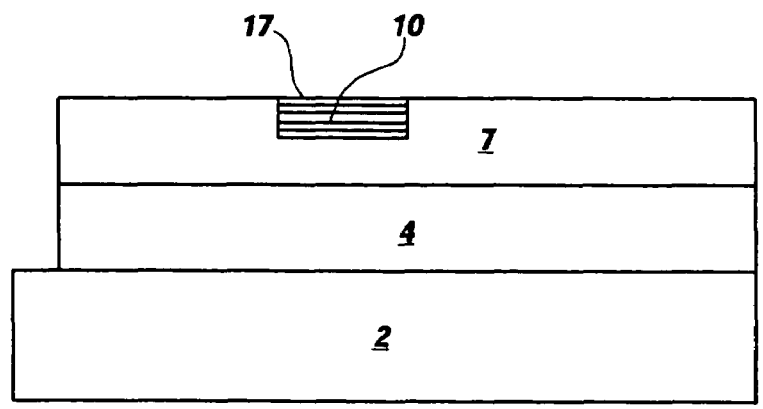

Referring to FIG. 1D, a stressable material 10 may be deposited within aperture 8. Any undesired amounts of stressable material 10 which are deposited on a top surface of metal traces 7 or between portions of adjacent metal traces 7 may be removed by masking and etching. Stressable material 10 may be a metallic material, such as molybdenum-chromium alloys or nickel-zirconium alloys. Stressable material 10 may also be formed from metals or alloys comprising chromium, copper, aluminum, or nickel. The stressable material 10 may exhibit a stress gradient across its cross-section from the top surface 17 to the bottom surface of aperture 8. At the very least, stressable material 10 must exhibit an at least partially tensile stress state. The stress gradient exhibits the highest compressive stresses at the interface with the metal of metal traces 7 and the highest tensile stresses at the top surface 17 of stressable material 10 with the transition from compression to tension being around the midpoint of the cross-section.

The stressable material 10 may be deposited within aperture 8 using a sputtering or a plating process. For instance, by varying the pressure of the plasma gas (e.g., argon) used in the sputter deposition of stressable material 10, the desired stress gradient may be controlled. For low pressures of the plasma gas (e.g., approximately 1 mTorr) the stressable material 10 will be under compressive stress. As the pressure of the plasma gas increases, a film stress in the deposited stressable material 10 changes to a tensile stress state and increases with increasing gas pressure. Thus, by depositing stressable material 10 in successive layers with an increasing plasma pressure with each additional layer, a stress gradient will be developed. At ambient temperature, the stress gradient exhibits the highest compressive stresses at the interface with the metal of metal traces 7 and the highest tensile stresses at the top surface 17 of stressable material 10 with the transition from compression to tension being around the midpoint in depth of the cross-section. Other techniques for tailoring the stress state of stressable material 10 include application of a radio frequency (RF) bias to the substrate 2 to reduce the stress in stressable material 10 from tensile to compressive. Also, heating the substrate 2 will increase the tensile component of the stress state of stressable material 10.

The stress gradient present in stressable material 10 may be controlled by depositing stressable material 10 as a multi-layered material with each layer deposited at a different temperature. As alluded to above, stressable material 10 may be deposited using a sputtering or a plating technique such as, for example, electroplating or electroless plating. By depositing successive layers of a stressable material at different temperatures, an appropriate stress gradient may be developed in stressable material 10. As an example, the substrate 2 may be a silicon wafer and the stressable material 10 may be a multi-layer mass of nickel. In this example, the silicon has a coefficient of thermal expansion (CTE) of 2.9 ppm, which is significantly lower than the 19 ppm CTE of nickel. A first layer of a stressable material 10 comprising nickel may be deposited at 90° C. by electroless plating and a second layer of stressable material 10 comprising nickel may be deposited at 100° C. by electroless plating. Deposition of the stressable material 10 at or below about 100° C. minimizes the diffusion of metal from metal traces 7 into the substrate 2 and conserves the thermal budget. However, if metal diffusion into substrate 2 is not a concern, the first layer of stressable material 10 may be deposited at 100° C. and the second layer of stressable material 10 may be deposited at 400° C. for a greatly enhanced stress gradient. The temperatures used above for the deposition of stressable material 10 are merely illustrative and other combinations will be apparent to one of ordinary skill in the art upon reviewing the above examples. At ambient temperature, this multi-layered structure for stressable material 10 produces a stress gradient exhibiting the highest compressive stresses at the interface with the metal of metal traces 7 and the highest tensile stresses at the top surface 17 of stressable material 10, with the transition from compression to tension being around the midpoint of the cross-section of the mass of stressable material 10.

In another example, the substrate 2 may be selected from a material with a CTE greater than the stressable material 10, such as an FR-4 or FR-5 material having a CTE around 17 ppm. In this example, a first layer of a stressable material 10 having a CTE less than that of substrate 2 may be deposited at 100° C. by electroless plating. A second layer of stressable material 10 formed from the same material as the first layer of stressable material 10 may be deposited at 90° C. by electroless plating. Suitable metals having a CTE less than the 17 ppm CTE of an FR-4 or FR-5 material that may be used to form the first and second layer of stressable material 10 are chromium, tungsten, and titanium. Again, if diffusion of metal from metal traces 7 is not a concern, the first layer of stressable material 10 may be deposited at 400° C. and the second layer of stressable material 10 at 100° C. At ambient temperature, this multi-layered structure for stressable material 10 produces a stress gradient exhibiting the highest compressive stresses at the interface with the metal of metal traces 7 and the highest tensile stresses at the top surface 17 of stressable material 10 with the transition from compression to tension being around the midpoint of the cross-section. Thus, using any one of the above mentioned deposition techniques, the stress gradient of stressable material 10 may be accurately tailored for the particular application.

Stressable material 10 may also comprise a single layer of a sputtered or plated material. For instance, nickel may be sputtered or plated, for example, at 90° C. onto the metal traces 7 secured to a silicon substrate. Once the temperature is brought down to ambient temperature, stressable material 10 will be put under tension.

Another exemplary method for forming the stressable material 10 having an at least partially tensile stress state is by depositing a metal or alloy of one composition by two different deposition techniques (e.g., sputtering, electroplating, or electroless plating). For example, nickel or an alloy thereof may be deposited by sputtering to fill a portion of aperture 8. The remaining volume of aperture 8 may be filled by depositing the same composition of nickel or alloy thereof using a different deposition technique, such as electroplating.

Figure 1E:
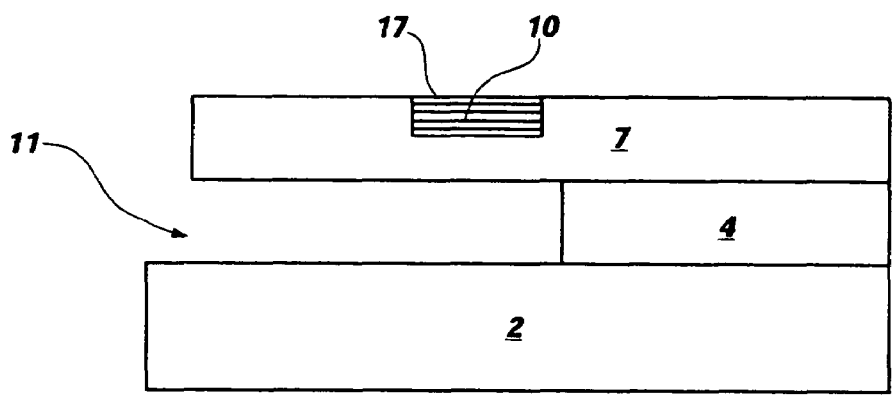
Figure 1F:
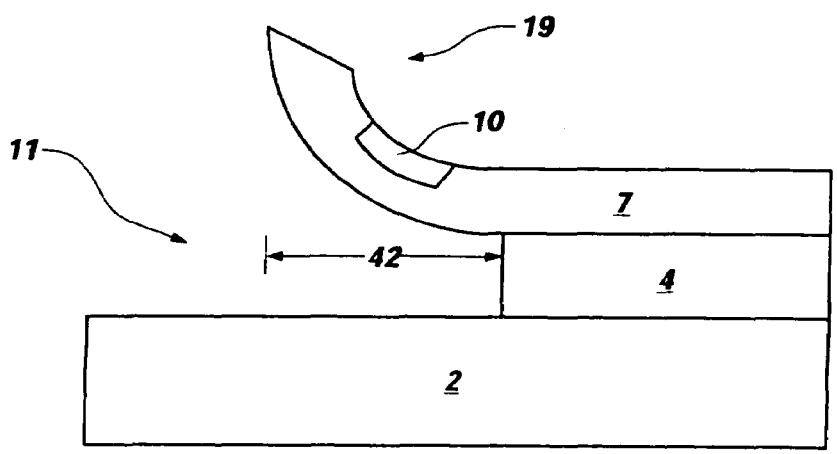

Referring to FIG. 1E, the release layer 4 (if present) may be laterally etched using a dry etch, plasma etch, or a selective wet etch to remove portion 11 thereof. A selective etch will etch the release layer 4 faster than it removes metal from any of the metal containing films. HF acid solutions are suitable for use as the selective wet etch to etch release layer 4 comprising silicon oxide or silicon nitride. As shown in FIG. 1F, upon laterally etching to remove portion 11 of release layer 4, the portion of metal trace 7 over the removed portion of release layer 4 curves upward as a result of the stress gradient present in stressable material 10 to form a plurality of compliant spring contacts 19, each having a free, cantilevered portion 42 with a substantially arcuate shape. Aperture 8 including the stressable material 10 may be completely contained within the free, cantilevered portion 42 or aperture 8 including the stressable material 10 may be partially within the free, cantilevered portion 42 and partially located within the anchored portion of the spring contact 19.

Figure 1G:
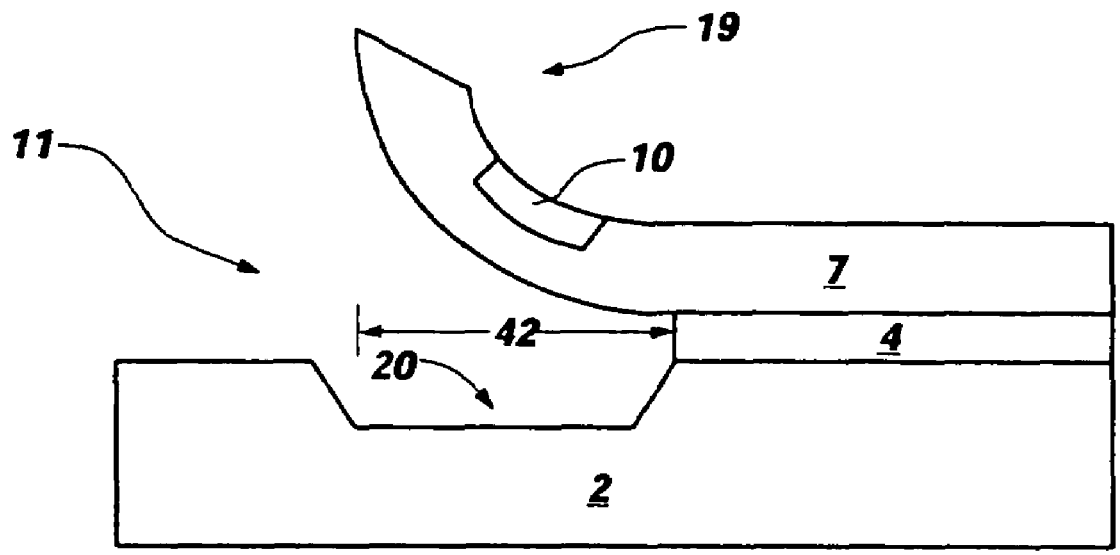
FIG. 1G illustrates the compliant spring contact of FIG. 1F having a recess etched in the underlying substrate.
Figure 1H:
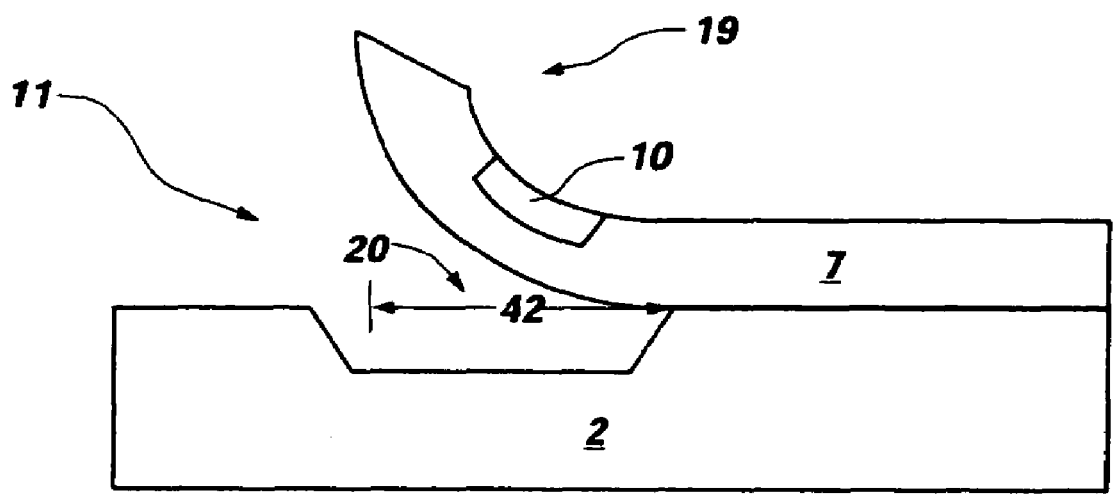
FIG. 1H illustrates the compliant spring contact of FIG. 1G without a release layer.

In another exemplary embodiment, that is a variation of the embodiment described in FIGS. 1A-1F, the substrate 2 may be etched to provide more room for the spring contact 19 to deflect downwardly when it is loaded. Referring to FIG. 1G, the films are processed to the structure illustrated in FIG. 1F. Then, by masking portions of substrate 2 that are not desired to be etched and using a selective etch designed to preferentially attack substrate 2, recess 20, located underneath free, cantilevered portion 42, is created in the unmasked portions of substrate 2, resulting in the structure illustrated in FIG. 1G. A suitable etchant is 6% tetramethyl ammonium hydroxide (TMAH) in propylene glycol when substrate 2 is made from single crystal silicon. TMAH is a suitable anisotropic etchant because it will not substantially etch metal, thus not etching metal traces 7, and preferentially etches specific crystal planes of silicon (the (100) and (011) crystal planes) to produce the faceted shape of recess 20. Also, TMAH does not form an oxide. Furthermore, when the embodiment shown in FIG. 1G is used, release layer 4 may be significantly thinner or simply not used because the spring contact 19 is given additional room to deflect downwardly due to the space provided by recess 20. The TMAH solution will preferentially etch the silicon used for the substrate 2 underneath the metal traces 7 to form recess 20, and cause the resulting free, cantilevered portion 42 to be biased away from substrate 2 due to the stresses present in stressable material 10 as shown in FIG. 1H.

Figure 2A:
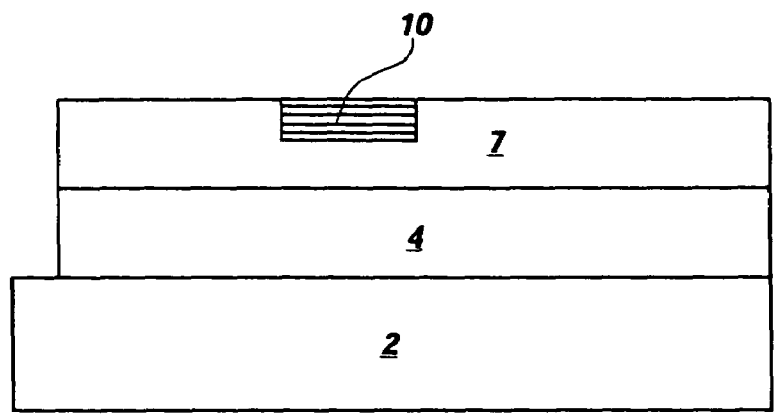
FIGS. 2A-2E illustrate a method of making an exemplary compliant spring contact according to the present invention and the resulting structure having a wettable and nonwettable coating thereon.
Figure 2B:
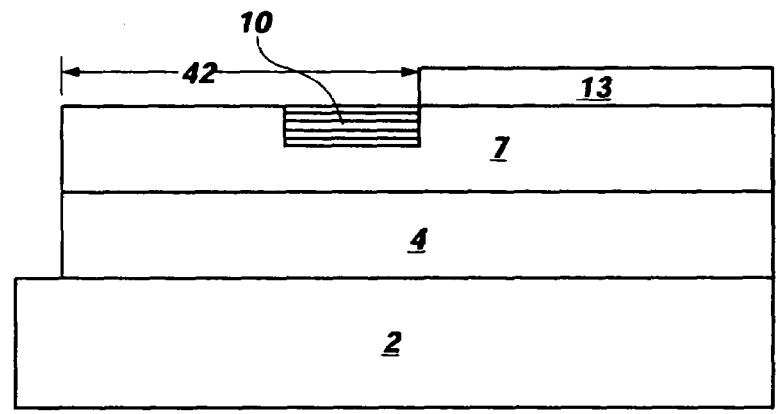
Figure 2C:
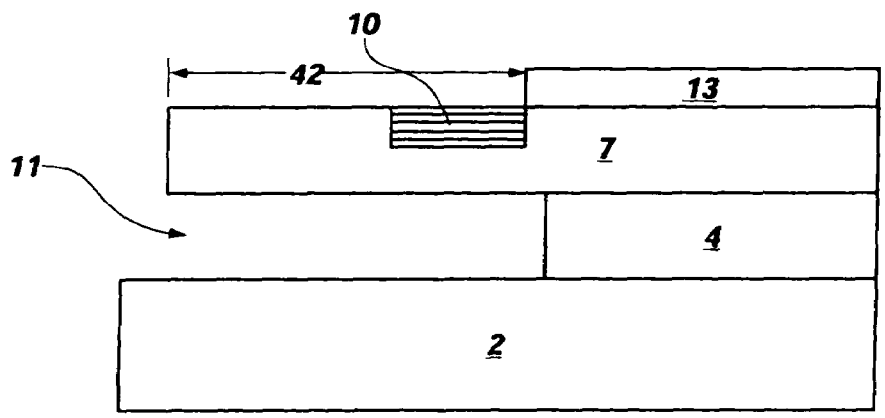

Another exemplary embodiment for forming compliant spring contacts of the present invention is shown in FIGS. 2A-2E. Referring to FIG. 2A, the material films are processed to the structure illustrated in the previously described embodiment shown in FIG. 1D. Nonwettable (by solder) metal layer 13 may be deposited over the metal traces 7 by way of sputtering, CVD, or other suitable techniques. Again, in order to minimize diffusion of metals from metal traces 7 into the substrate 2, the temperature used during deposition may be kept below 100° C. A supported region of metal traces 7 may then be masked and any unwanted amounts of nonwettable metal layer 13 coating intervening portions between the metal traces 7 and coating free, cantilevered portion 42 of metal traces 7 may be removed by etching, resulting in the structure shown in FIG. 2B. The materials for nonwettable metal layer 13 are selected so that it will not be wetted by typical solders used in the semiconductor industry. Exemplary materials for nonwettable metal layer 13 are titanium, aluminum, alloys thereof, or any other metal or alloy that will not allow typical tin/lead solders to wet it. Then, as shown in FIG. 2C, release layer 4 may be laterally etched using a dry etch, a plasma etch, or a selective wet etch to remove portion 11. The etch employed will etch the release layer 4 faster than it removes metal from any of the metal containing films.

Figure 2D:
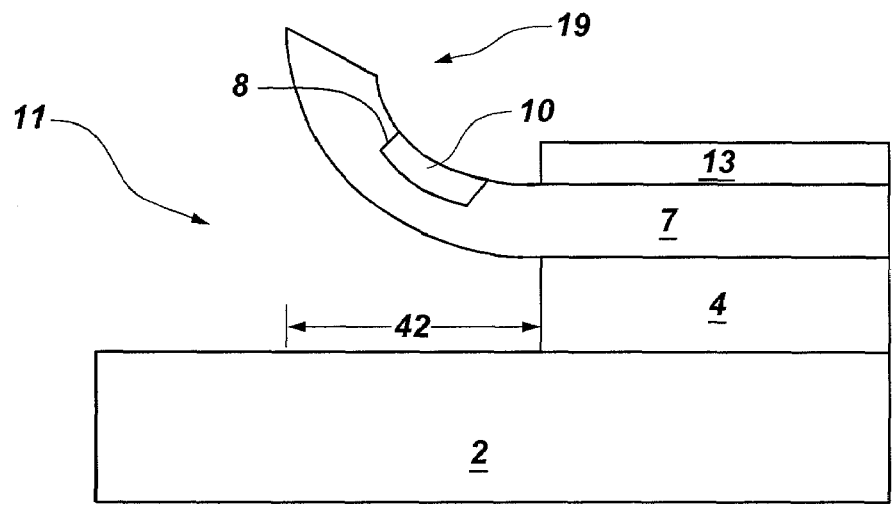
Figure 2E:
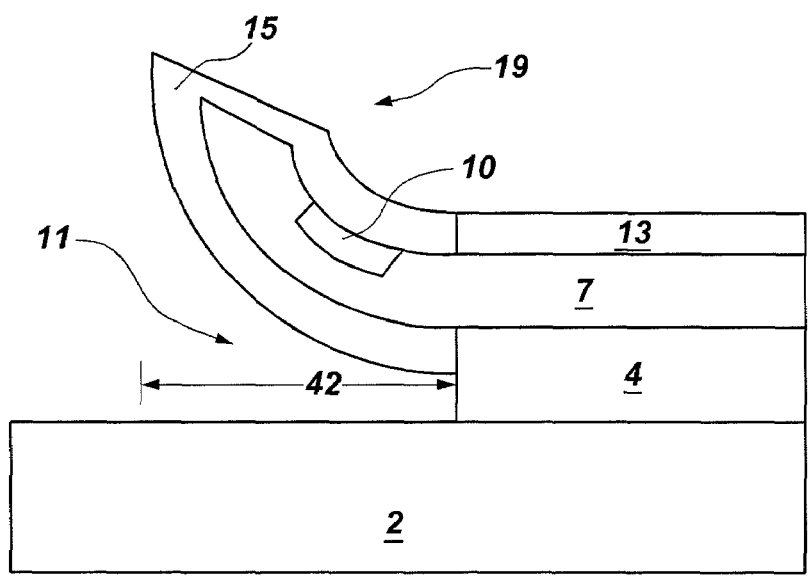

Referring to FIG. 2D, once portion 11 is removed, metal traces 7 curve upward due to the stresses present in stressable material 10 to form compliant spring contacts 19. Aperture 8, including the stressable material 10, may be completely contained within the free, cantilevered portion 42 of each spring contact 19. Aperture 8, including the stressable material 10, may also be located partially within the free, cantilevered portion 42 and partially within the anchored portion of the spring contact 19. As shown in FIG. 2E, a wettable metal layer 15 may be deposited to cover the spring contact 19. Any amount of wettable metal layer 15 covering portions other than the free, cantilevered portion 42 of spring contact 19 may be removed by etching. The materials for wettable metal layer 15 are selected so that it will be wetted by typical solders used in the semiconductor industry. Exemplary materials for wettable metal layer 15 are gold, silver, copper, nickel, alloys thereof, or any other metal or alloy that will allow typical lead or tin solders to wet it. Electroplating or electroless deposition is a suitable technique for depositing wettable metal layer 15. If needed, a seed layer, such as tungsten, may be deposited on the free, cantilevered portion 42 of spring contact 19 to assist in the nucleation of wettable metal layer 15 during the plating process. By limiting the portion of spring contact 19 that may be wet by the solder alloy during soldering, the solder covers only the compliant portion of spring contact 19 (i.e., the free, cantilevered portion 42). The solder used to bond the spring contact 19 to a bond or terminal pad having solder thereon on another electrical device will wick the solder onto the free, cantilevered portion 42 to form a tapered soldered joint which terminates at nonwettable metal layer 13. Thus, when spring contact 19 is loaded after being soldered, the spring contact 19 may still deflect instead of fracturing since it does not have an excess amount of solder on it, extending over the fixed portion of the spring contact 19 as would occur without nonwettable metal layer 13.

Figure 2F:
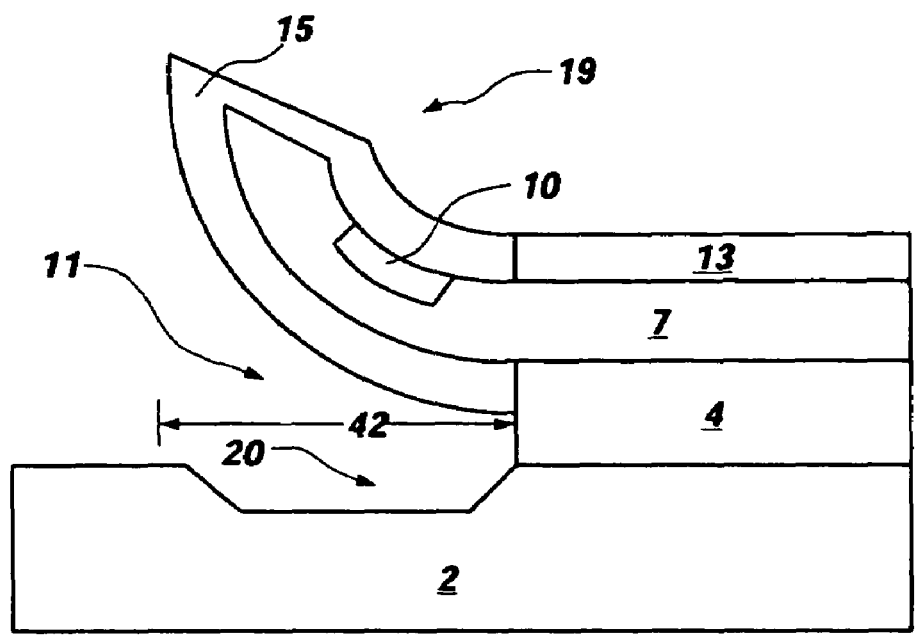
FIG. 2F illustrates the compliant spring contact of FIG. 2E having a recess etched in the underlying substrate.
Figure 2G:
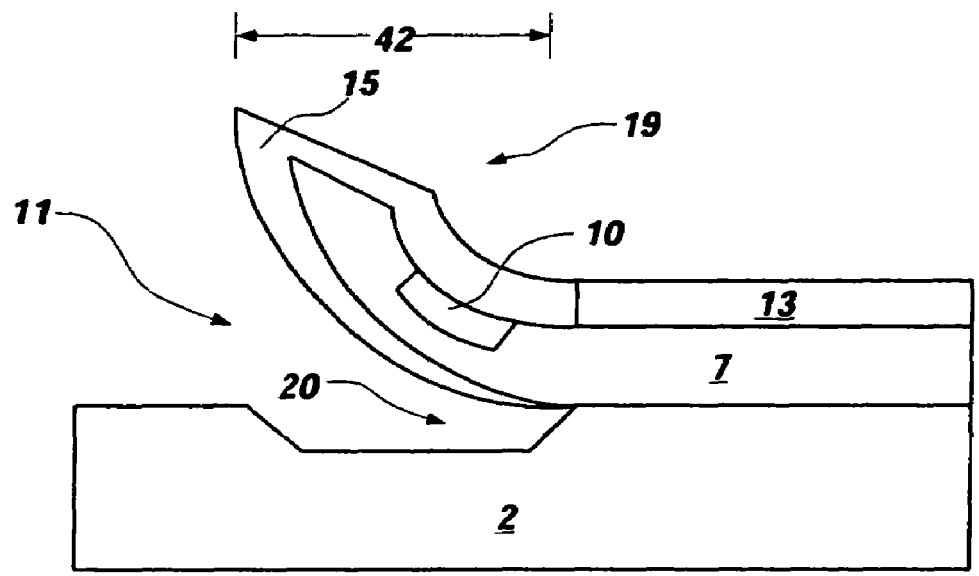
FIG. 2G illustrates the compliant spring contact of FIG. 2F without a release layer.

In another exemplary embodiment, that is a variation of the embodiment described in FIGS. 2A-2E, the substrate 2 may be etched to provide more clearance for the spring contact 19 to deflect when it is loaded. Referring to FIG. 2F, the films are processed to the structure illustrated in FIG. 2E. By masking portions of substrate 2 that are not desired to be etched and using a selective etch designed to preferentially attack substrate 2, recess 20, located underneath free, cantilevered portion 42, is created in the unmasked portions of substrate 2, resulting in the structure illustrated in FIG. 2F. A suitable etchant is the aforementioned 6% tetramethyl ammonium hydroxide (TMAH) in propylene glycol when substrate 2 is made from single crystal silicon. Furthermore, when the embodiment shown in FIG. 2F is used, release layer 4 may be significantly thinner or may simply not be used because the spring contact 19 is given room to deflect due to the presence of recess 20. The TMAH solution will preferentially etch the silicon used for the substrate 2 underneath the metal traces 7 to form recess 20, and cause the resulting free, cantilevered portion 42 to be biased away from substrate 2 due to the stresses present in stressable material 10, as shown in FIG. 2G.

Figure 3A:
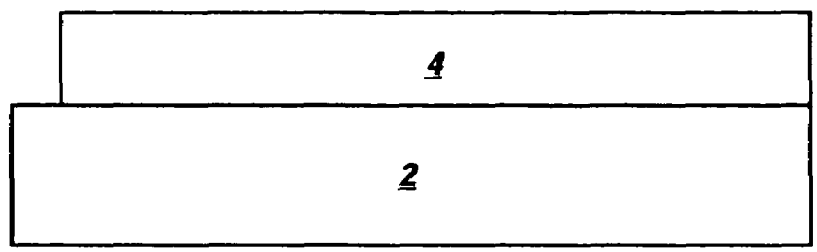
FIGS. 3A-3F illustrate a method of making an exemplary compliant spring contact according to the present invention and the resulting structure using a solder deposit as the stressable material.

In yet another exemplary embodiment, FIGS. 3A-3G illustrate a variation of the above mentioned embodiments that utilizes a selective deposit of solder on metal traces to produce the required stresses in the films to create spring contacts. Referring to FIG. 3A, a substrate 2 is provided having a release layer 4 deposited thereon. Substrate 2 may be formed from a semiconductor material, such as single crystal silicon, single crystal gallium arsenide, polysilicon, indium phosphide, a layered bulk semiconductor substrate (such as a silicon on insulator (SOI) substrate as exemplified by a silicon on glass (SOG) or silicon on sapphire (SOS) substrate), or any other suitable material. Substrate 2 may also comprise a carrier substrate formed, for example, of BT resin or comprising an FR-4 or FR-5 laminate, a ceramic substrate, a silicon substrate, a flexible circuit board, or any other type of rigid or flexible circuit board material known to one of ordinary skill in the art. Release layer 4 may be an oxide or nitride such as, for example, silicon dioxide or silicon nitride formed by chemical vapor deposition (CVD), atomic layer deposition (ALD), reactive sputtering, or another suitable technique. Release layer 4 may also be formed from a variety of polymeric materials such as, for example, a polyimide processed by spinning a film onto the substrate 2, screen printing, or applying a preformed polyimide tape.

Figure 3B:
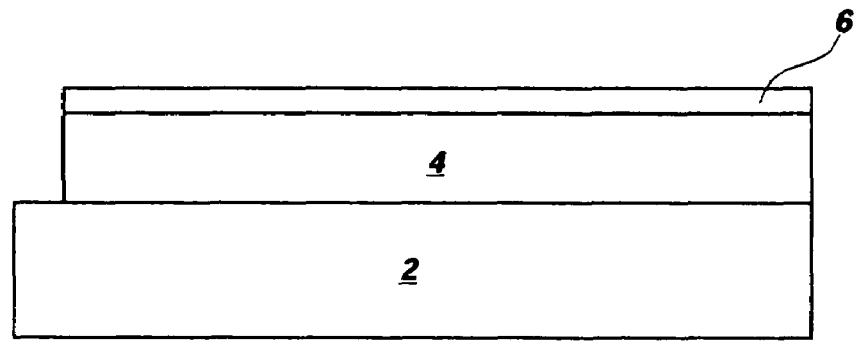
Figure 3C:
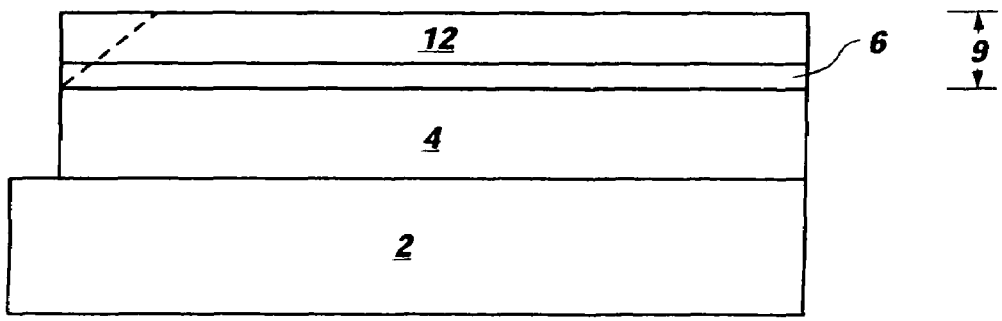

As shown in FIG. 3B, a metal film 6, which will be used to form a portion of spring contact 21, is deposited on release layer 4 using evaporation, sputtering, CVD, or other suitable techniques. Metal film 6 may be, for example, a layer of aluminum, another metal, or an alloy. As shown in FIG. 3C, a metal film 12 may be deposited thereon to form a layered structure. Metal film 12 may be, for example, a layer of nickel, another metal, or an alloy deposited using evaporation, sputtering, CVD, or other suitable techniques. The layered structure comprised of metal film 6 and metal film 12 may be subsequently patterned and etched using standard photolithography techniques common to semiconductor device fabrication to form a plurality of metal traces 9. Metal traces 9 may form the external electrical contacts for a semiconductor die or dice, a circuit board, or the electrical contacts of a probe for testing semiconductor devices. Metal traces 9 may also be bonded directly to the bond pads of circuitry contained within substrate 2 to form the external electrical contacts for such devices. If desired, when forming metal traces 9, metal films 6 and 12 may be patterned and subsequently etched using conventional photolithography techniques to have a sharpened tip, as shown by the dashed line in FIG. 3C, to provide a tip with a small contact area for applications requiring a precision tip or to aid in breaking through a surface oxide on bond pads contacted by the metal traces 9. To facilitate soldering the spring contacts to corresponding bond or terminal pads on another electrical device, the tips of each of the metal traces 9 may be coated with a solder wettable material such as, for example, gold, silver, copper, nickel, alloys thereof, or any other metal or alloy that will allow typical lead or tin solders to wet it. The tips of each of the metal traces 9 may be coated with a solder wettable material by depositing a layer of one of the above metals or alloys on the upper surface of metal film 12 by CVD, evaporation, sputtering, electroplating, electroless plating, or another suitable technique, followed by photolithographically patterning and etching to leave only a small amount of solder wettable material covering a portion of metal film 12 that will form at least part of the tip of metal trace 9. Once the tip is coated with the solder wettable material, the metal traces 9 may be formed as described above.

Figure 3D:
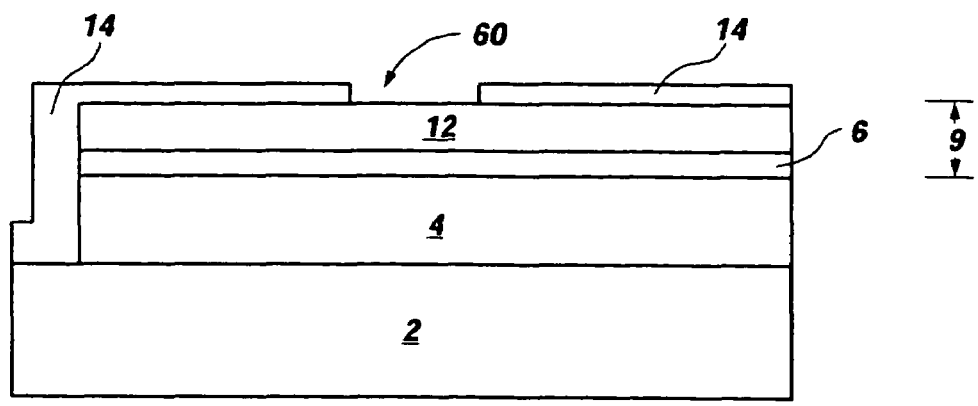
Figure 3E:
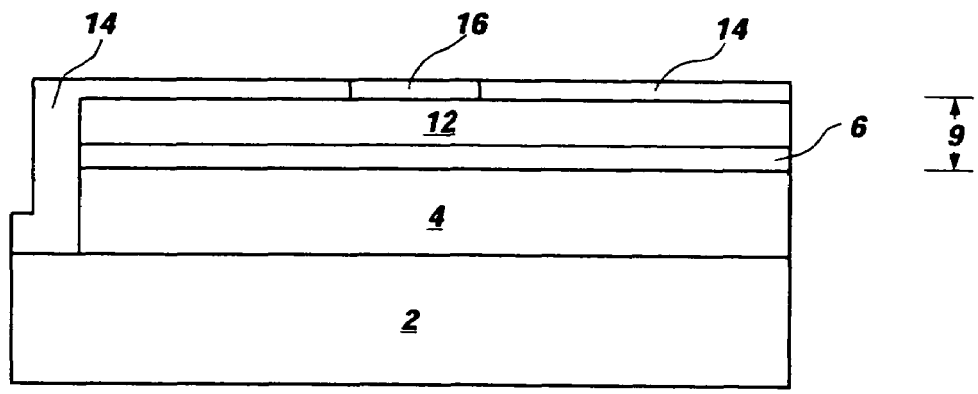

Referring to FIG. 3D, a photoresist 14 may be applied to substrate 2, the sidewalls of the layered structure comprised of release layer 4, metal traces 9, and the top surface of metal film 12. The photoresist 14 is subsequently developed to define an aperture 60 located over the top surface of metal film 12 as shown in FIG. 3D. Solder 16 formed from an alloy system such as, lead-tin, lead-indium, or tin-silver, among many others, may be applied to fill a space defined by aperture 60 as illustrated in FIG. 3E. The use of the photoresist 14 controls the dimensions of the deposit of solder 16 by defining aperture 60. Alternatively, the solder 16 may be deposited by stenciling, screen printing, or in a preformed block. If a resist is not employed, it is desirable to plate portions of metal film 12 adjacent the solder deposition site with a nonwettable material to prevent the solder 16 from spreading beyond the site on metal trace 9 desired to be stressed. After solder 16 is deposited, it may be heated to reflow preferably by localized heating to conserve the thermal budget of the substrate 2, and allowed to cool and solidify, placing it in a tensile stress state. This is due, in part, to solder 16 exhibiting a CTE that is greater than the CTE of metal traces 9. For example, metal film 12 may be formed from nickel having a CTE of 19 ppm and the solder 16 may exhibit a CTE of 33 ppm.

Figure 3F:
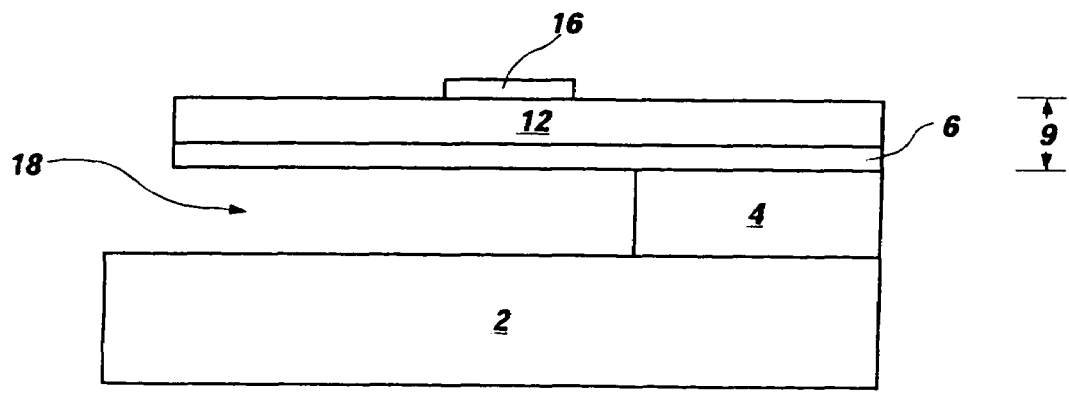
Figure 3G:
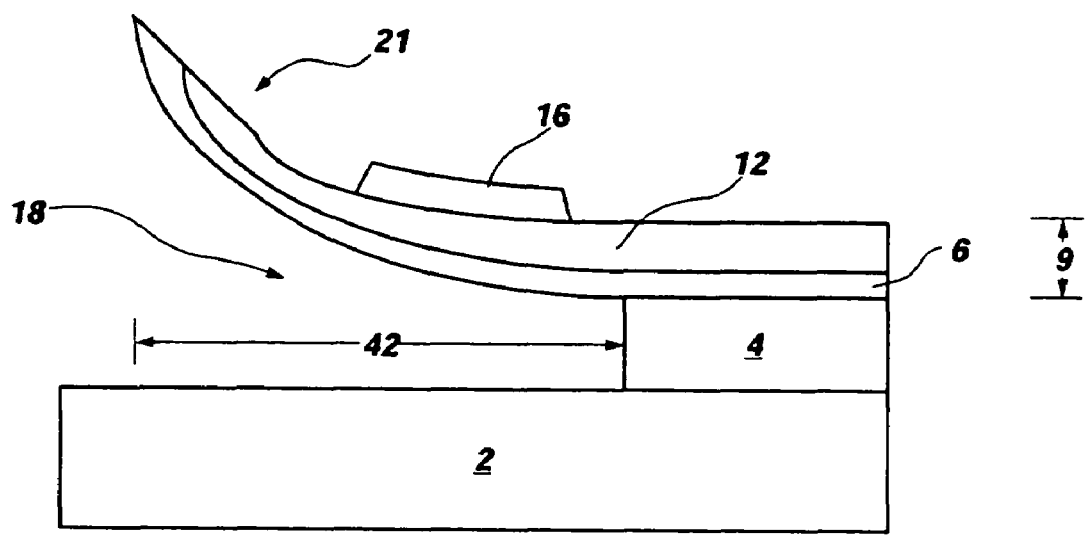
FIGS. 3G-3H illustrate the compliant spring contact of FIG. 3F having a recess etched in the underlying substrate.

As shown in FIG. 3F, upon filling aperture 60 with solder 16 and removing photoresist 14 (if present), the release layer 4 may be laterally etched using a dry etch, a plasma etch, or a selective wet etch to remove portion 18. The selective etch will etch the release layer 4 faster than it removes metal from any of the metal containing films. HF acid solutions are suitable for use as the selective wet etch. As shown in FIG. 3G, upon laterally etching to remove portion 18 of release layer 4, the metal trace 9 curves upward as a result of the tensile stresses present in solder 16 to form a compliant spring contact 21 having a free, cantilevered portion 42 with a substantially arcuate shape.

Figure 3H:
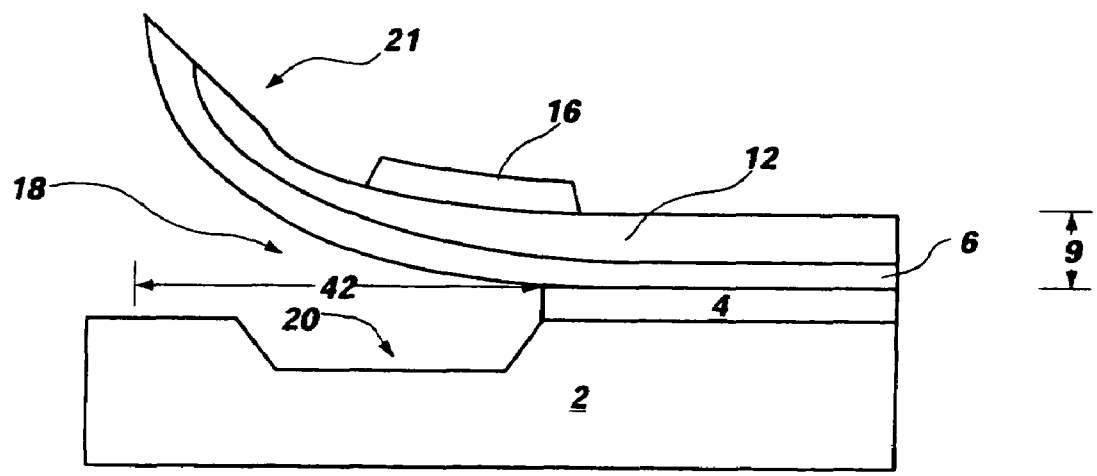
Figure 3I:
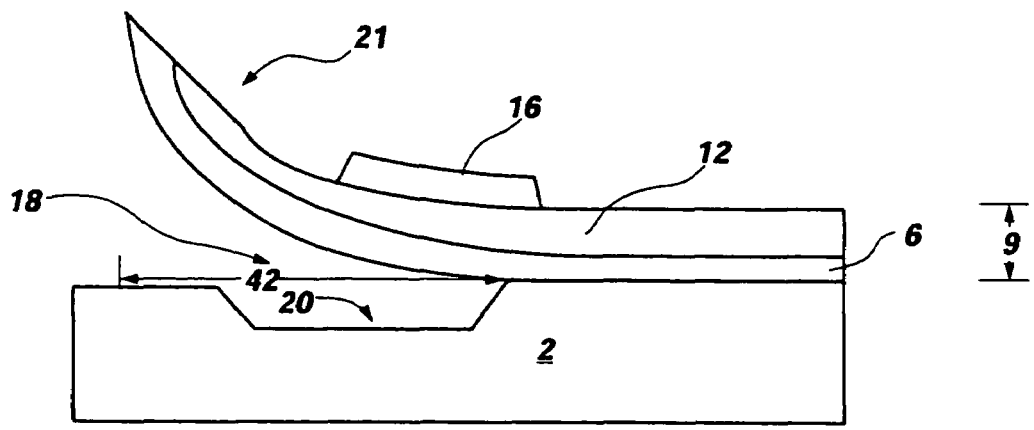
FIG. 3I illustrates the compliant spring contact of FIG. 3H without a release layer.

In another exemplary embodiment, that is a variation of the embodiment described in FIGS. 3A-3G, the substrate 2 may be etched to provide more room for the spring contact 21 to deflect when it is loaded. Referring to FIG. 3H, the films are processed to the structure illustrated in FIG. 3G. Then, by masking portions of substrate 2 that are not desired to be etched and using a selective etch designed to preferentially attack substrate 2, recess 20, located underneath free, cantilevered portion 42, is created in the unmasked portions resulting in the structure illustrated in FIG. 3H. A suitable etchant is the aforementioned 6% tetramethyl ammonium hydroxide (TMAH) in propylene glycol when substrate 2 is made from single crystal silicon. Furthermore, when the embodiment shown in FIG. 3H is used, release layer 4 may be significantly thinner or may simply not be used as shown in FIG. 3I because the spring contact 21 is given room to deflect due to the space provided by recess 20. The TMAH solution will preferentially etch the silicon used for the substrate 2 underneath the metal traces 9 to form recess 20, and cause the resulting free, cantilevered portion 42 to be biased away from substrate 2 due to the stresses present in solder 16.

Figure 4A:
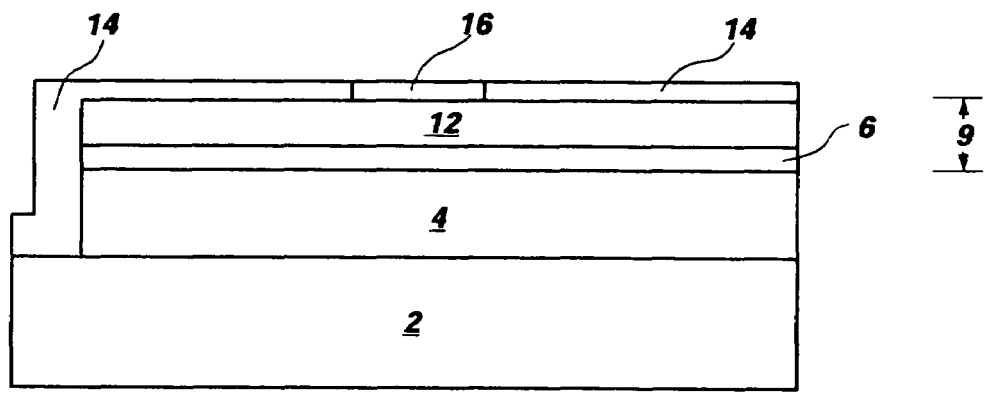
FIGS. 4A-4F illustrate a method of making an exemplary compliant spring contact according to the present invention and the resulting structure having a wettable and nonwettable coating thereon.
Figure 4B:
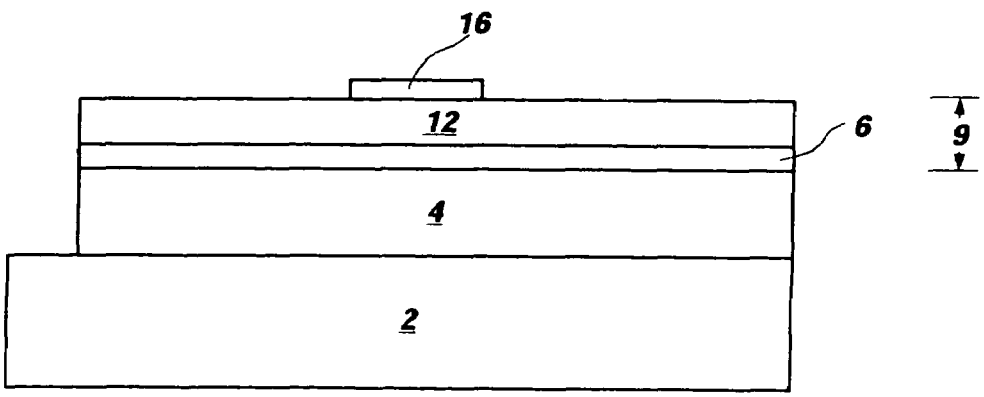
Figure 4C:
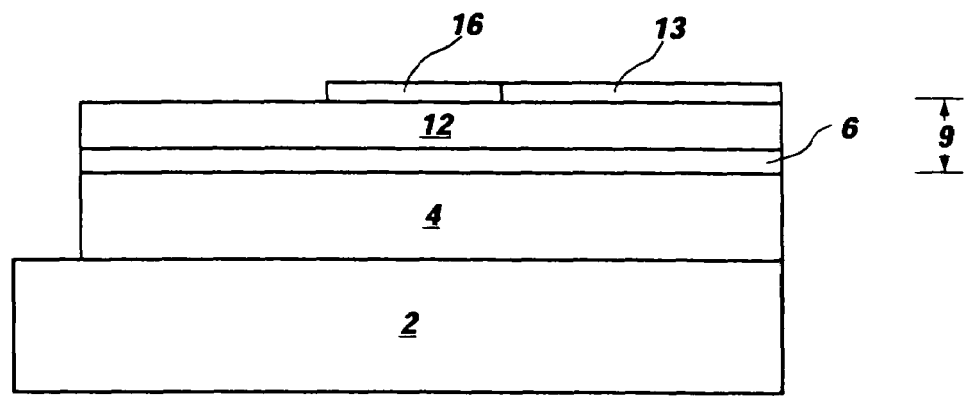
Figure 4D:
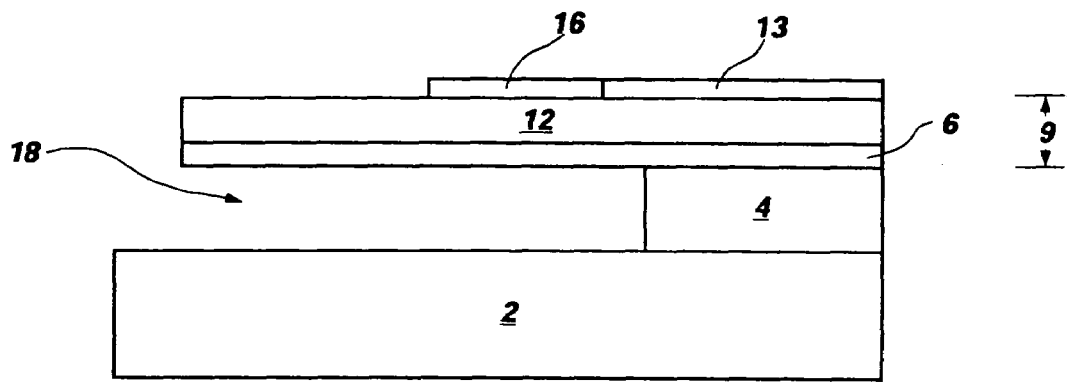

Another exemplary embodiment for forming compliant spring contacts of the present invention is shown in FIGS. 4A-4F. Referring to FIG. 4A, the material films are processed to the structure illustrated in the previously described embodiment shown in FIG. 3E. FIG. 4B illustrates the structure of FIG. 4A after the photoresist 14 (if used) is removed. Nonwettable metal layer 13 may be deposited over the metal traces 9 by way of sputtering, CVD, or other suitable techniques. The supported region of metal traces 9 may then be masked and any unwanted amounts of nonwettable metal layer 13 coating the regions between metal traces 9 and coating the free, cantilevered portion 42 of metal traces 9 may be removed by etching, resulting in the structure shown in FIG. 4C. The materials for nonwettable metal layer 13 are selected so that it will not be wetted by typical lead or tin solders used in the semiconductor industry. Exemplary materials for nonwettable metal layer 13 are titanium, aluminum, alloys thereof, or any other metal or alloy that will not allow typical solders to wet it. Then, as shown in FIG. 4D, release layer 4 may be laterally etched using a dry etch, a plasma etch, or a selective wet etch to form aperture 8.

Figure 4E:
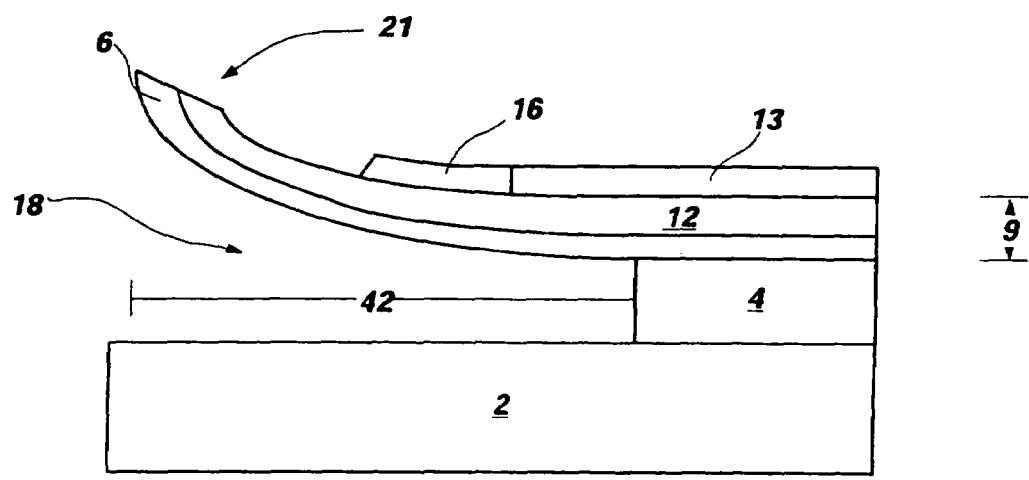
Figure 4F:
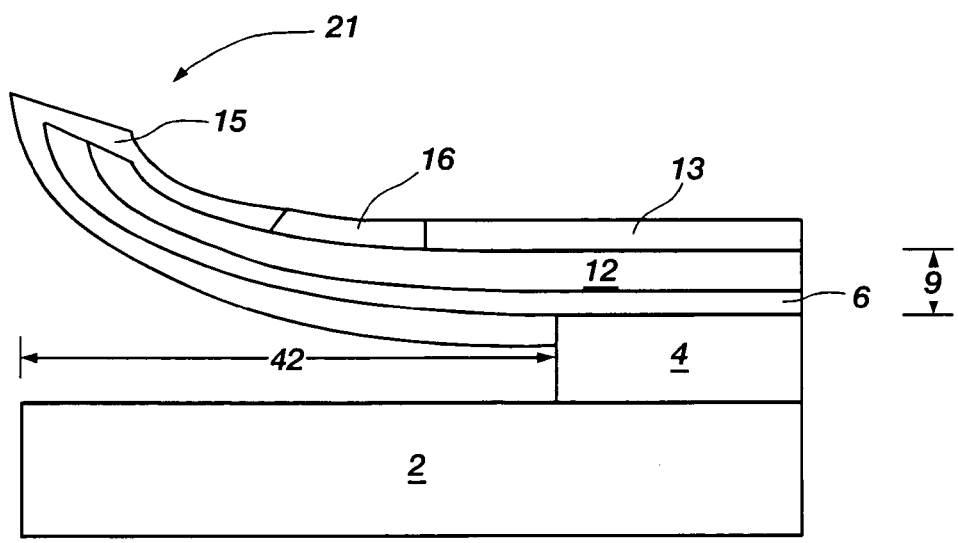

Referring to FIG. 4E, once the release layer 4 is laterally etched, metal trace 9 curves upwards due to the tensile stresses present in solder 16 to form a compliant spring contact 21. As shown in FIG. 4F, a wettable metal layer 15 may be deposited covering the spring contact 21. Any amount of wettable metal layer 15 covering portions other than the free, cantilevered portion 42 of spring contact 21 may be removed by etching. The materials for wettable metal layer 15 are selected so that it will be wetted by typical lead or tin solders used in the semiconductor industry. Exemplary materials for wettable metal layer 15 are gold, silver, copper, nickel, alloys thereof, or any other metal or alloy that will allow typical solders to wet it. Electroplating or electroless deposition is a suitable technique for depositing wettable metal layer 15. If needed, a seed layer, such as tungsten, may be deposited on the free, cantilevered portion of spring contact 21 to assist in the nucleation of wettable metal layer 15 during the plating process. By limiting the portion of spring contact 21 that may be wet by the solder alloy during soldering, the solder may cover only the compliant portion of spring contact 21 (i.e., the free, cantilevered portion 42). Thus, the solder used to bond the spring contact 21 to a bond pad having solder thereon on another electrical device will wick the solder up onto the free, cantilevered portion 42 forming a tapered soldered joint, stopping at nonwettable metal layer 13. Thus, when spring contact 21 is loaded after being soldered, the spring contact 21 may still deflect instead of fracturing since it does not have an excess amount of solder on it as would result if metal layer 13 is not used.

Figure 4G:
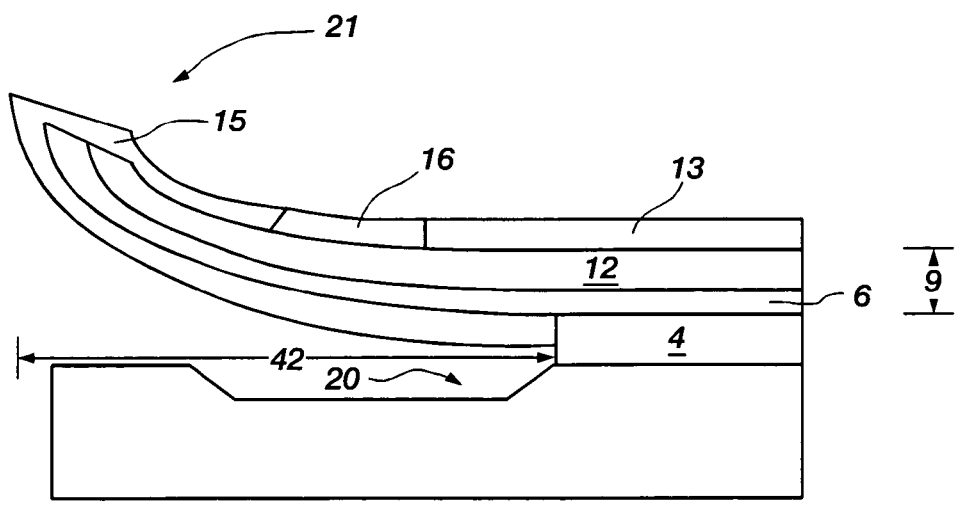
FIG. 4G illustrates the compliant spring contact of FIG. 4F having a recess etched in the underlying substrate.
Figure 4H:
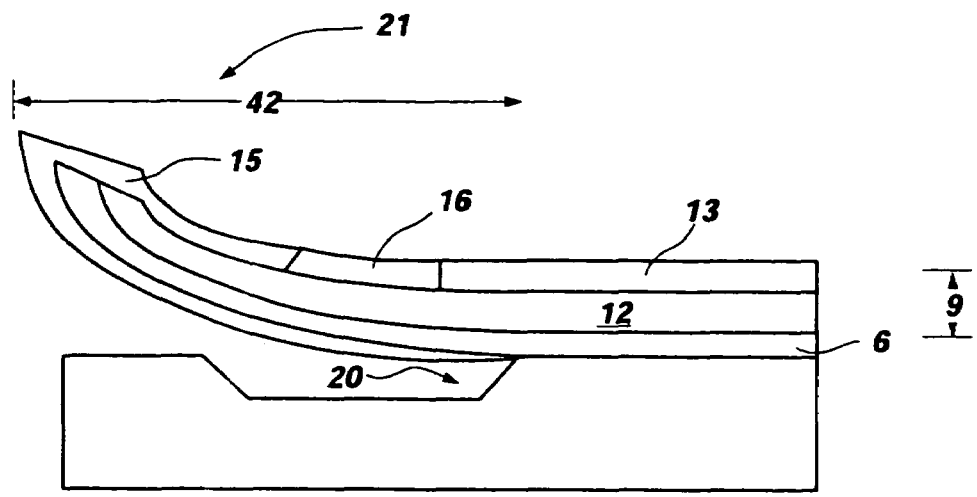
FIG. 4H illustrates the compliant spring contact of FIG. 4G without a release layer.

In yet another exemplary embodiment that is a variation of the embodiment described in FIGS. 4A-4F, the substrate 2 may be etched to provide more space for the spring contact 21 to bend when it is loaded. Referring to FIG. 4G, the films are processed to the structure illustrated in FIG. 4F. By masking portions of substrate 2 that are not desired to be etched and using a selective etch designed to preferentially attack substrate 2, recess 20, located underneath free, cantilevered portion 42, is created in the unmasked portions resulting in the structure illustrated in FIG. 4G. Again, as with the aforementioned embodiments, a suitable etchant is a 6% tetramethyl ammonium hydroxide (TMAH) in propylene glycol when substrate 2 is made from single crystal silicon. Furthermore, when the embodiment shown in FIG. 4G is used, release layer 4 may be significantly thinner or simply not used as shown in FIG. 4H because the spring contact 21 is given room to deflect due to the presence of recess 20. The TMAH solution will preferentially etch the silicon used for the substrate 2 underneath the metal traces 9 to form recess 20, and cause the resulting free, cantilevered portion 42 to be biased away from substrate 2 due to the stresses present in stressable material 10.

The compliant spring contacts of the present invention may be used in a variety of different applications, such as in flip-chip type connection of an electrical device with another external electrical device or as a probe card to test integrated circuits. As previously stated, substrate 2 may be a substrate of a semiconductor device or a carrier substrate with spring contacts 19 or 21 comprising its external electrical contacts.

Figure 5A:
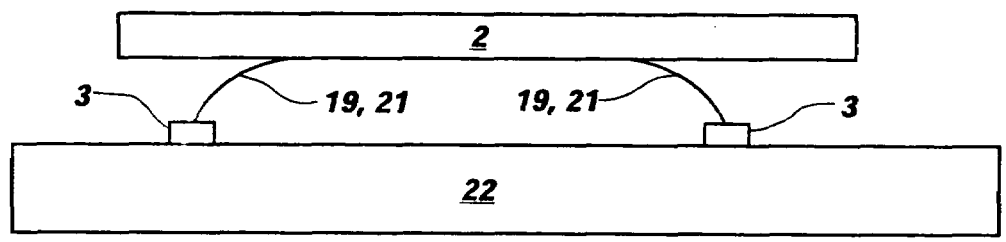
FIGS. 5A-5D schematically illustrate an electrical device utilizing the compliant spring contacts of the present invention to provide a flip-chip type contact to another electrical device.
Figure 5B:
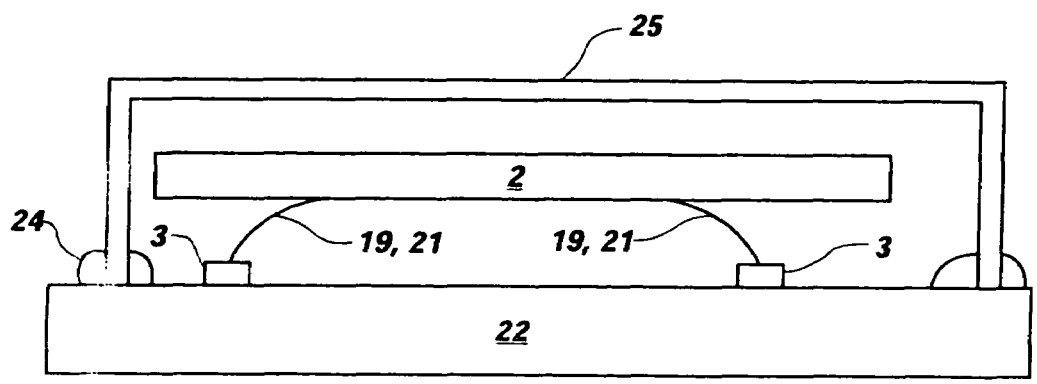

Referring to FIGS. 5A and 5B, in one particular application, substrate 2 formed of a semiconductor material having spring contacts 19 or 21 may be a semiconductor die or dice in electrical communication with substrate 22. Substrate 22 may be a carrier substrate, such as a PCB. Although not shown, it is understood that substrate 22 may have external electrical contacts to enable electrical connection to higher level devices. In FIG. 5A, an array of spring contacts 19 or 21 formed on substrate 2 in accordance with the present invention may be contacted to corresponding terminal pads 3 on substrate 22. Terminal pads 3, being formed from a solder wettable material or having a solder wettable metallization layer, may be used to provide permanent electrical connections with the circuitry of substrate 22. The spring contacts 19 or 21 may be connected to terminal pads 3 by stenciling or screening bricks of solder material on the terminal pads 3 and heating the assembly of substrate 2 and substrate 22 with the two components fixed in place at a temperature sufficient to cause the bricks of solder to reflow, as is commonly known in the art. Due to the compliant mechanical behavior of spring contacts 19 or 21, a dielectric underfill material between substrate 2 and substrate 22 is not necessary to mechanically stabilize substrate 2 and substrate 22 relative to each other. In an exemplary embodiment shown in FIG. 5B, a cover 25 may be used to cover, protect, and hermetically seal substrate 2 and its corresponding spring contacts 19 or 21 with substrate 22 using an adhesive 24. The cover 25 prevents moisture or other foreign substances from degrading spring contacts 19 or 21 by corrosion or interfering with the spring contacts 19 or 21 from contacting terminal pads 3. Furthermore, the cover 25 protects the substrate 2 and its corresponding spring contacts 19 or 21 from being damaged due to impact during handling and use. In the exemplary embodiments shown in FIGS. 5A and 5B, if substrate 2 or 22 expands or contracts at different rates due to thermal stresses and differing CTEs, spring contacts 19 or 21 may compliantly deflect to accommodate the mismatch. This ability to accommodate thermal stresses helps prevent fracturing of the spring contacts 19 or 21, their respective solder joints to terminal pads 3, or both. It is also noted that a conventional transfer molded package of silicon particle filled, thermoplastic polymer, may be formed over substrate 22 and between substrate 2 and 22 in lieu of using a cover 25. However, this approach will obviously prevent spring contacts 19 or 21 from deflecting.

Figure 5C:
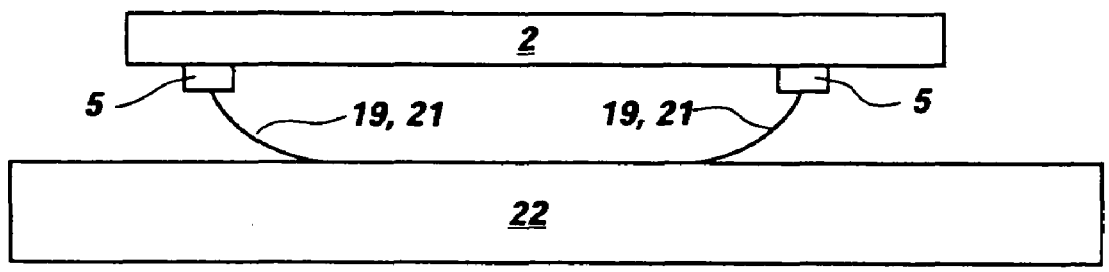
Figure 5D:
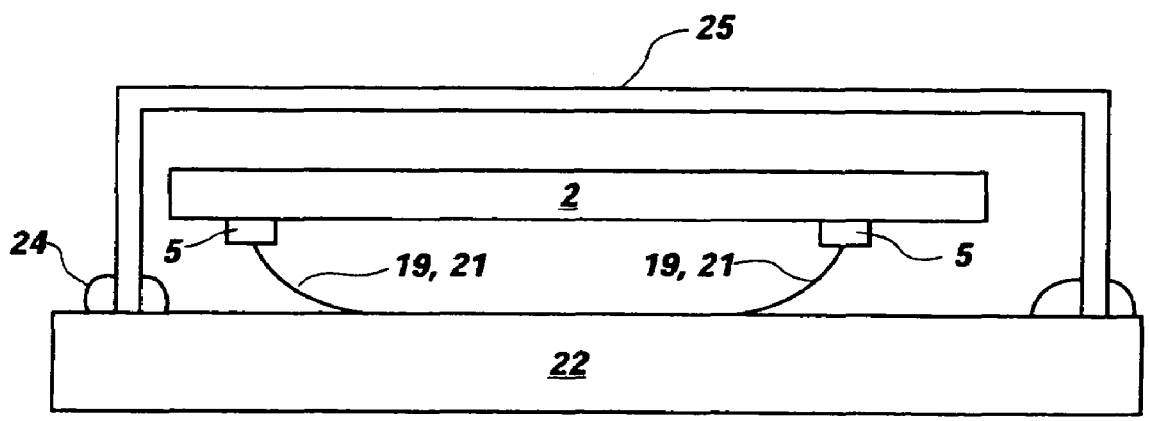

In another particular application illustrated in FIGS. 5C and 5D, substrate 22 having spring contacts 19 or 21 may be a carrier substrate in electrical communication with substrate 2, which may be a semiconductor die or dice. As with the aforementioned embodiments described in FIGS. 5A and 5B, spring contacts 19 or 21 may be connected to bond pads 5 on substrate 2 by stenciling or screening bricks of solder material on the bond pads 5 and heating the assembly of substrate 2 and substrate 22 with the two components fixed in place to a temperature sufficient to cause the bricks of solder to reflow as is commonly known in the art. The bond pads 5 may have a contact surface of about 70 µm by 90 µm. Furthermore, as with the exemplary embodiment shown in FIGS. 5A and 5B, the spring contacts 19 or 21 of substrate 22 may compliantly deflect to accommodate CTE mismatch between the substrate 2 and the substrate 22 during use.

Figure 6A:
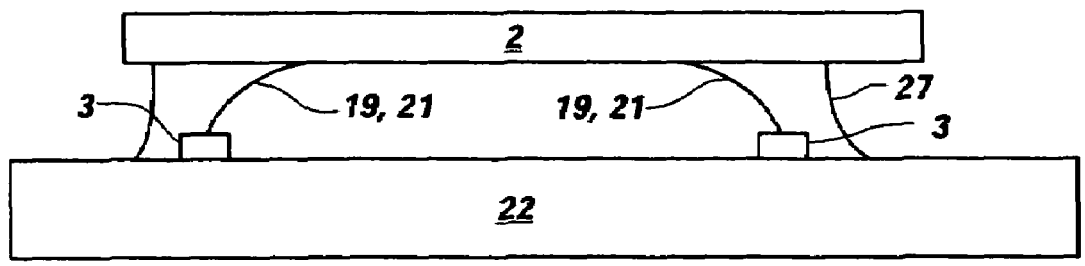
FIGS. 6A-6D illustrate an electrical device utilizing the compliant spring contacts of the present invention to provide a flip-chip type contact to another electrical device, wherein a protective dielectric underfill is used.
Figure 6B:
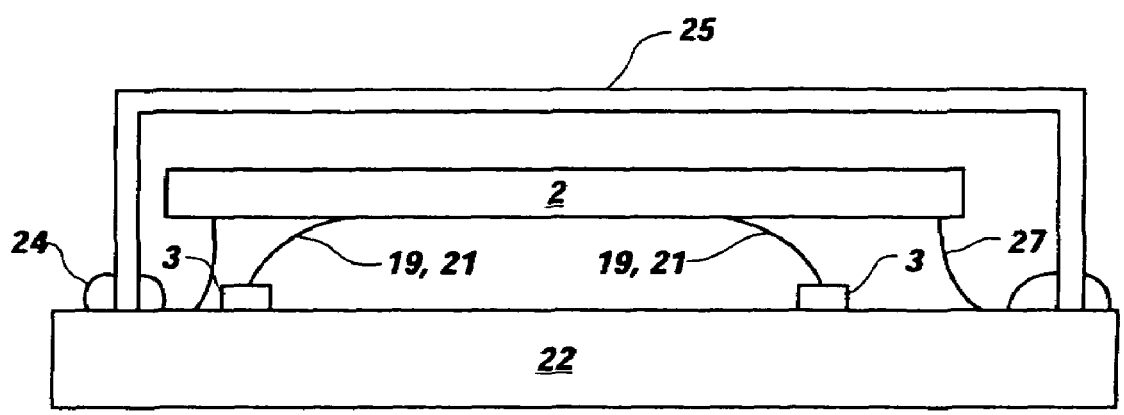

In another exemplary embodiment that is a variation of the embodiment shown in FIGS. 5A and 5B, FIG. 6A discloses an array of spring contacts 19 or 21 formed on substrate 2 in accordance with the present invention contacting corresponding terminal pads 3 on substrate 22. In the embodiment depicted in FIGS. 6A and 6B, the substrate 2 may be a semiconductor die or dice and the substrate 22 may be a carrier substrate, such as a printed circuit board. The spring contacts 19 or 21 may be connected to terminal pads 3 by stenciling or screening bricks of solder material on the terminal pads 3 and heating the assembly of substrate 2 and 22 at a temperature sufficient to cause the bricks of solder to reflow, as is commonly known in the art followed by cooling to solidify the solder. A dielectric underfill material 27 may be introduced between the substrate 2 and 22 to hold substrate 2 stationary with respect to substrate 22 and protect spring contacts 19 or 21 and terminal pads 3 from mechanical stress and environmental degradation. The dielectric underfill material 27 may be formed by stereolithographic techniques, injecting the dielectric underfill material 27 between the substrate 2 and 22 to fill the volume therebetween, or any other suitable technique known to those of ordinary skill in the art. Referring to FIG. 6B, as with the previous embodiment shown in FIG. 5B, a cover 25 may be used to cover, protect, and hermetically seal substrate 2 and its corresponding spring contacts 19 or 21 with substrate 22.

Figure 6C:
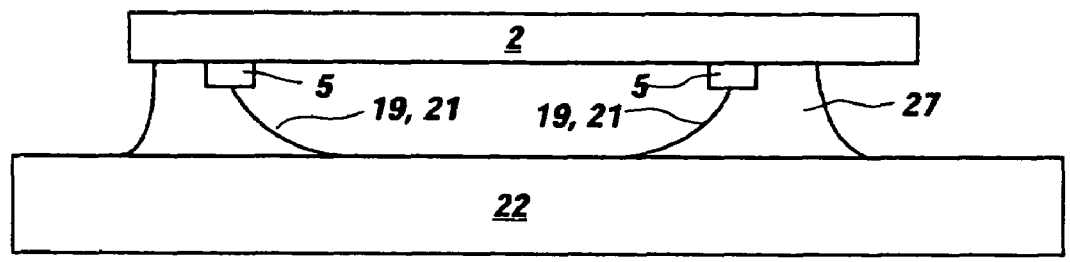
Figure 6D:
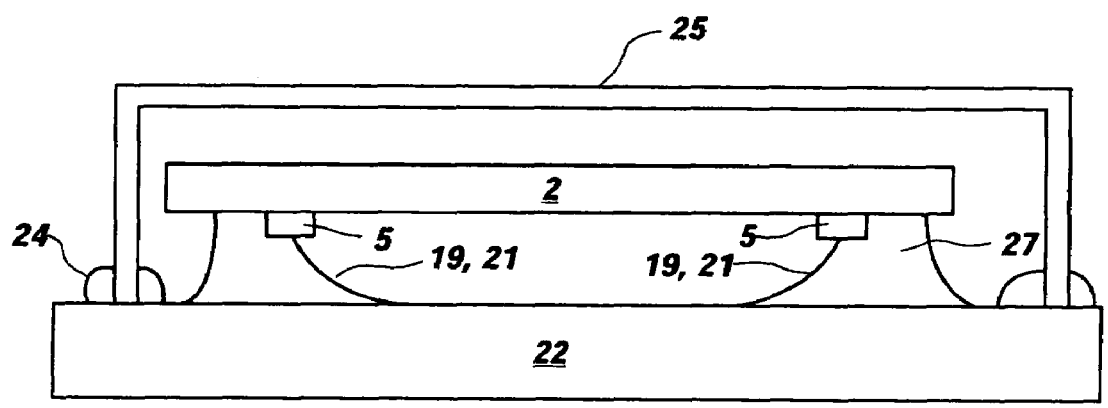

In another particular application illustrated in FIGS. 6C and 6D, substrate 22 having spring contacts 19 or 21 may be a carrier substrate in electrical communication with the bond pads 5 on substrate 2 which may be a semiconductor die or dice. The electrical connection between substrate 2 and 22 and the introduction of the dielectric underfill material 27 may be effected in the same manner as in the exemplary embodiment of FIGS. 6A and 6B.

Figure 7:
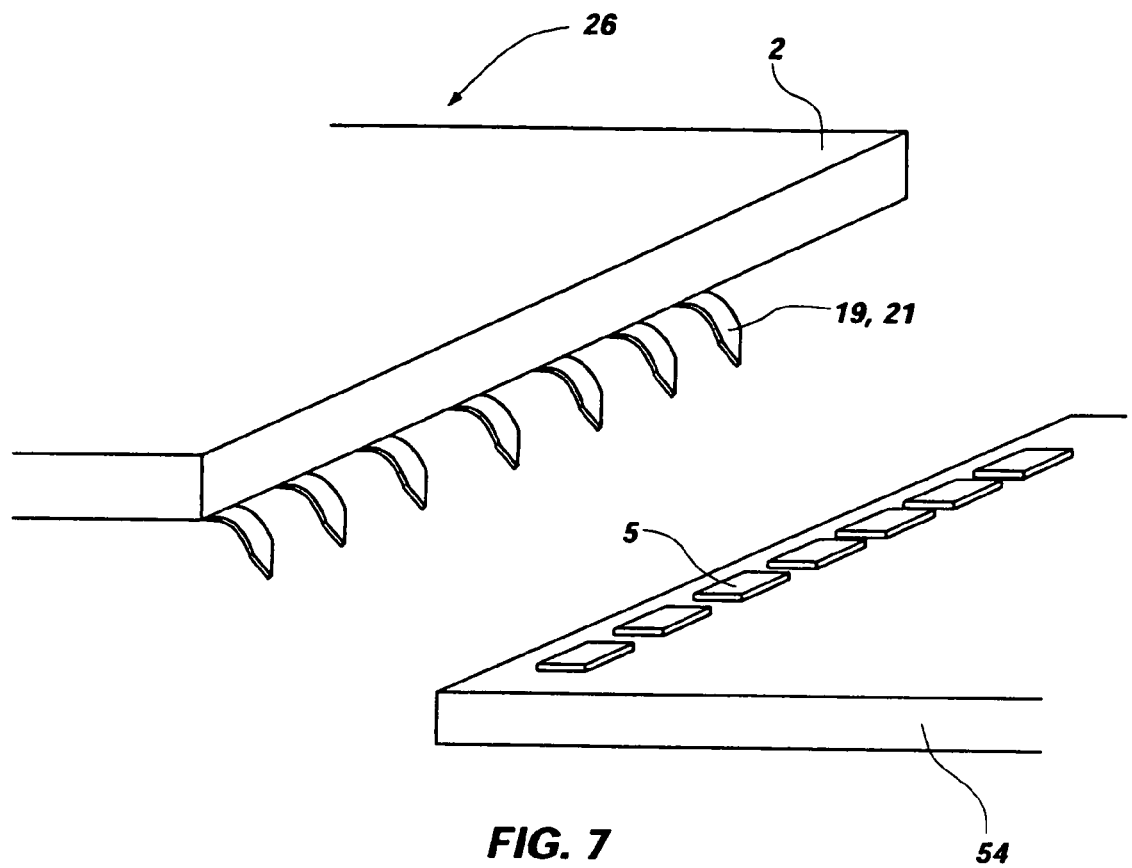
FIG. 7 illustrates a probe card utilizing the compliant spring contacts of the present invention.

Another use for the compliant spring contacts of the present invention is in probe cards. Probe cards 26 may be used to temporarily electrically connect two devices, wherein one of the devices is to be tested. Testing of semiconductor devices using probe cards is common in the semiconductor industry, where the probe cards are used to test semiconductor dice while the dice are still part of a wafer. FIG. 7 shows an exemplary embodiment where the probe card 26 has an array of spring contacts 19 or 21 used in place of the standard probe needles. The probe card 26 operates identically to a standard probe card used in the semiconductor industry except for having spring contacts 19 or 21 in accordance with the present invention. The probe card 26 is aligned with the semiconductor device 54 (e.g., a silicon wafer or semiconductor die having integrated circuitry thereon) such that the spring contacts 19 or 21 compliantly contact the corresponding bond pads 5 (having a contact surface area on the order of 70 µm by 90 µm) on the semiconductor device 54. The semiconductor device 54 is then tested or communicated with by a testing device electrically connected to the probe card 26. The substrate 2 of the probe card 26 is preferably formed from silicon containing circuitry thereon to distribute test signals to and from each semiconductor device 54 to be tested. By forming the substrate 2 from silicon, the CTE difference between the probe card 26 and the semiconductor device 54 (typically a silicon wafer or a semiconductor die diced from a silicon wafer) to be tested is minimized. Furthermore, wafer probe testing and burn-in testing of the semiconductor device 54 may occur over a wide temperature range between 125° C. to −55° C. Thus, minimizing the CTE difference between the probe card 26 and the semiconductor device 54 is particularly important on wafer-level testing due to the large dimensions of the wafer. The test signals may be distributed either all at once or sequentially to the substrate 2 of probe card 26. The probe card 26 may also be fabricated having enough spring contacts 19 or 21 to contact all of the bond pads of a particular integrated circuit being tested. This eliminates having to test an integrated circuit in sections due to not having enough electrical contacts, thus, improving process throughput.

Figure 8A:
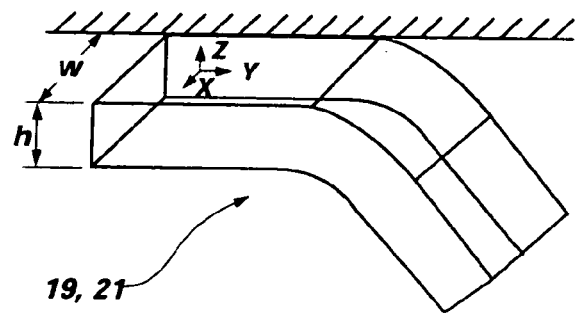
FIG. 8A illustrates a geometry of a compliant spring contact of the present invention.
Figure 8B:
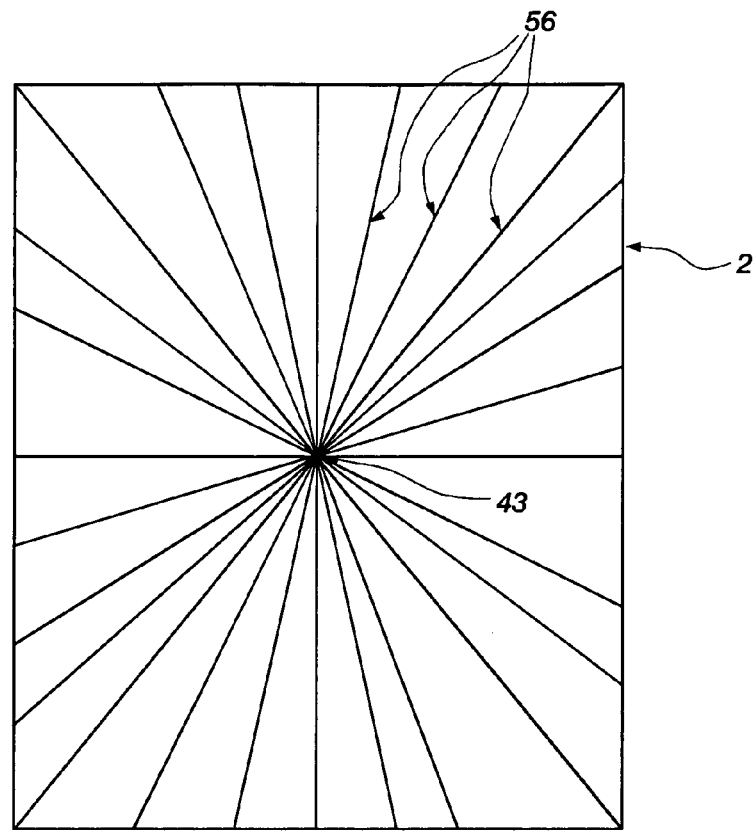
FIG. 8B illustrates an exemplary method of aligning the compliant spring contacts of the present invention on a substrate.
Figure 9:
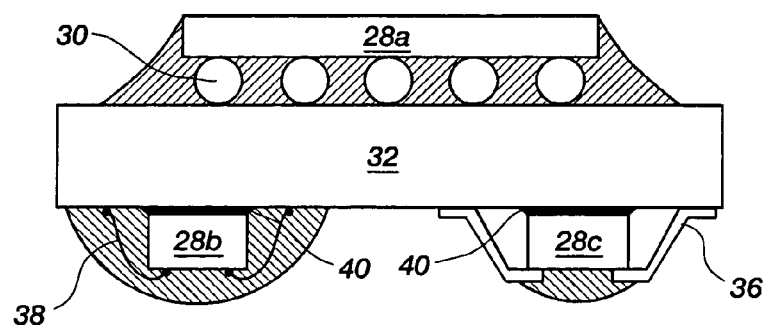
FIG. 9 illustrates conventional techniques for electrically connecting semiconductor chips to a printed circuit board.
Figure 10:
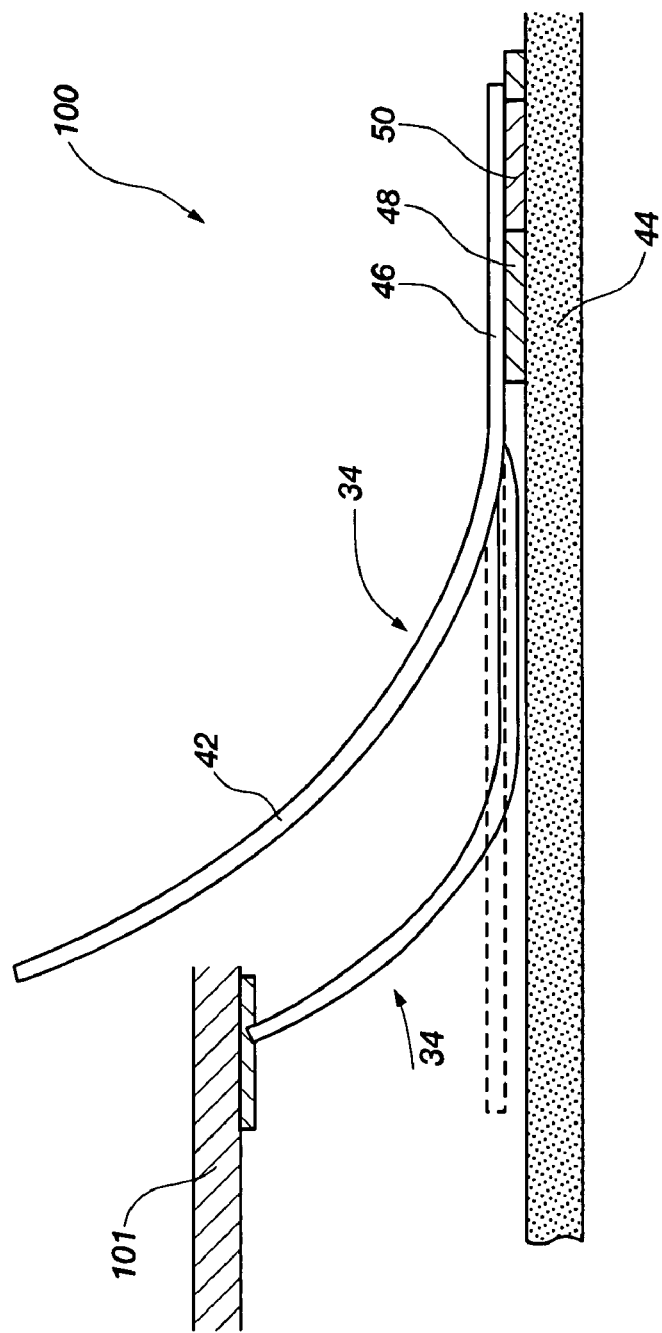
FIG. 10 illustrates an exemplary prior art spring contact.

In any of the exemplary embodiments illustrated in FIGS. 1-7, the spring contacts 19 or 21 may be oriented on substrate 2 or 22 such that the longitudinal elongation direction of spring contacts 19 or 21 (y-axis shown in FIG. 8A) is substantially aligned with the direction of thermal expansion and contraction of substrate 2 or 22. Thus, any substantial amount of deflection or deformation occurs in the most compliant orientations of the spring contacts 19 or 21. Referring to FIG. 8A, when substrate 2 having spring contacts 19 or 21 expands or contracts due to thermal expansion or contraction, spring contacts 19 or 21 are oriented in a preferred direction such that spring contacts 19 or 21 may most easily elastically deflect vertically in the z-axis direction, elastically elongate or contract in the y-axis direction, elastically bend about the x-axis, or combinations thereof. The preferred orientation of spring contacts 19 or 21 is in a direction that substantially reduces any twisting of the spring contacts 19 or 21 about the z-axis or the y-axis. Referring to FIG. 8B, spring contacts 19 or 21 are oriented with their respective y-axes oriented along reference lines 56 drawn from the center 43 (i.e., the null point) of a substrate 2 radially outward. By orienting spring contacts 19 or 21 along reference lines 56, their elastic deformation is substantially confined to the z-axis direction in combination with elongation or contraction in the y-axis direction. If the spring contacts 19 or 21 are soldered to terminal or bond pads of another electrical device, as in flip-chip applications, this preferred orientation prevents the spring contacts 19 or 21 and the soldered joints connecting spring contacts 19 or 21 with the terminal or bond pads from fracturing due to thermal stresses.

If the spring contacts 19 or 21 are not soldered to terminal or bond pads, such as when testing another electrical device employing a probe card, the preferential orientation results in the spring contacts 19 or 21 sliding on the terminal or bond pads of the electrical device to be tested after making contact therewith due to their resiliency and the tendency to plastically deform or break is not as great as with conventional probe contacts. The preferential orientation of spring contacts 19 or 21 may be used to cause the spring contacts 19 or 21 to slide on the terminal or bond pads and scrub off an oxide layer which forms on some bond pads (i.e., aluminum bond pads) for better electrical contact.

Although the foregoing description contains many specifics, these are not to be construed as limiting the scope of the present invention, but merely as providing certain exemplary embodiments. Similarly, other embodiments of the invention may be devised which do not depart from the spirit or scope of the present invention. The scope of the invention is, therefore, indicated and limited only by the appended claims and their legal equivalents, rather than by the foregoing description. All additions, deletions, and modifications to the invention, as disclosed herein, which fall within the meaning and scope of the claims are encompassed by the present invention.

What is claimed is:

1. An electrical device comprising:
a substrate having a plurality of compliant electrical contacts, at least one of the plurality of compliant electrical contacts in electrical communication with a circuitry on or within the substrate, each of the plurality of compliant electrical contacts comprising:
at least one conductive trace secured to the substrate, the at least one conductive trace having a free, cantilevered portion, the at least one conductive trace having bonded thereto only on an upper surface thereof at least one stressed material filling an aperture within the at least one conductive trace and extending over at least part of the free, cantilevered portion and having a length less than a full length of the at least one conductive trace, the at least one stressed material exhibiting an at least partially tensile stress state sufficient to bias the free, cantilevered portion away from the substrate.

2. The electrical device of claim 1, further comprising at least one insulating layer disposed between the substrate and a portion of the at least one conductive trace secured thereto.

3. The electrical device of claim 2, wherein the at least one stressed material comprises a first layer bonded to the at least one conductive trace exhibiting an at least partially compressive stress state and a second layer at least partially superimposed over and bonded to the first layer exhibiting an at least partially tensile stress state.

4. The electrical device of claim 3, wherein the substrate comprises a recess located underneath the free, cantilevered portion of the at least one conductive trace.

5. The electrical device of claim 4, further comprising a solder wettable material coating at least part of the free, cantilevered portion.

6. The electrical device of claim 5, further comprising a material nonwettable by a solder covering a portion of the at least one conductive trace secured to the substrate.

7. The electrical device of claim 1, wherein the substrate comprises a recess located underneath the free, cantilevered portion of the at least one conductive trace.

8. The electrical device of claim 1, further comprising a solder wettable material coating at least part of the free, cantilevered portion.

9. The electrical device of claim 8, further comprising a material nonwettable by a solder covering a portion of the at least one conductive trace secured to the substrate.

10. The electrical device of claim 1, wherein the free, cantilevered portion comprises a sharpened end.

11. The electrical device of claim 1, wherein a longitudinal axis of the at least one of the plurality of compliant electrical contacts is aligned with a reference line that extends substantially radially from a center of the substrate radially outward.

12. The electrical device of claim 1, wherein the substrate comprises a semiconductor material, a ceramic material, or a polymeric material.

13. The electrical device of claim 1, wherein the at least one conductive trace comprises a first conductive layer and a second conductive layer disposed on the first conductive layer.

14. The electrical device of claim 13, wherein the at least one stressed material comprises solder disposed on the second conductive layer, the solder having a coefficient of thermal expansion greater than a coefficient of thermal expansion of the second conductive layer.

15. A probe card comprising:
a substrate having a plurality of compliant electrical contacts, each of the plurality of compliant electrical contacts comprising:
at least one conductive trace secured to the substrate, the at least one conductive trace having a free, cantilevered portion, the at least one conductive trace having bonded thereto only on an upper surface thereof at least one stressed material filling an aperture within the at least one conductive trace and extending over at least part of the free, cantilevered portion and having a length less than a full length of the at least one conductive trace, the at least one stressed material exhibiting an at least partially tensile stress state sufficient to bias the free, cantilevered portion away from the substrate.

16. The probe card of claim 15, further comprising at least one insulating layer disposed between the substrate and a portion of the at least one conductive trace secured thereto.

17. The probe card of claim 16, wherein the at least one stressed material comprises a first layer exhibiting an at least partially compressive stress state and a second layer at least partially superimposed over and bonded to the first layer exhibiting an at least partially tensile stress state.

18. The probe card of claim 17, wherein the substrate comprises a recess located underneath the free, cantilevered portion of the at least one conductive trace.

19. The probe card of claim 18, further comprising a solder wettable material coating at least part of the free, cantilevered portion.

20. The probe card of claim 19, further comprising a material nonwettable by a solder covering a portion of the at least one conductive trace secured to the substrate.

21. The probe card of claim 15, wherein the substrate comprises a recess located underneath the free, cantilevered portion of the at least one conductive trace.

22. The probe card of claim 15, further comprising a solder wettable material coating at least part of the free, cantilevered portion.

23. The probe card of claim 22, further comprising a material nonwettable by a solder covering a portion of the at least one conductive trace secured to the substrate.

24. The probe card of claim 15, wherein the free, cantilevered portion comprises a sharpened end.

25. The probe card of claim 15, wherein the substrate comprises a semiconductor material, a ceramic material, or a polymeric material.

26. The probe card of claim 15, wherein the at least one conductive trace comprises a first conductive layer and a second conductive layer disposed on the first conductive layer.

27. The probe card of claim 26, wherein the at least one stressed material comprises solder disposed on the second conductive layer, the solder having a coefficient of thermal expansion greater than a coefficient of thermal expansion of the second conductive layer.

28. The probe card of claim 15, wherein the at least one stressed material comprises a first layer exhibiting an at least partially compressive stress state and a second layer at least partially superimposed over and bonded to the first layer exhibiting an at least partially tensile stress state.

29. The probe card of claim 15, wherein a longitudinal axis of at least one of the plurality of compliant electrical contacts is aligned with a reference line that extends substantially radially from a center of the substrate radially outward.

30. A semiconductor device assembly comprising:
a carrier substrate having a plurality of compliant electrical contacts, at least one of the plurality of compliant electrical contacts in electrical communication with a circuitry on or within the carrier substrate, each of the plurality of compliant electrical contacts comprising:
at least one conductive trace secured to the carrier substrate, the at least one conductive trace having a free, cantilevered portion, the at least one conductive trace having bonded thereto only on an upper surface thereof at least one stressed material filling an aperture within the at least one conductive trace and extending over at least part of the free, cantilevered portion and having a length less than a full length of the at least one conductive trace, the at least one stressed material exhibiting an at least partially tensile stress state sufficient to bias the free, cantilevered portion away from the carrier substrate; and
at least one semiconductor die having an active surface including a plurality of bond pads thereon, at least one of the plurality of bond pads bonded to one of the plurality of compliant electrical contacts of the carrier substrate.

31. The semiconductor device assembly of claim 30, further comprising at least one insulating layer disposed between the carrier substrate and a portion of the at least one conductive trace secured thereto.

32. The semiconductor device assembly of claim 30, wherein the at least one stressed material comprises a first layer bonded to the at least one conductive trace exhibiting an at least partially compressive stress state and a second layer at least partially superimposed over and bonded to the first layer exhibiting an at least partially tensile stress state.

33. The semiconductor device assembly of claim 30, wherein the carrier substrate comprises a recess located underneath the free, cantilevered portion of the at least one conductive trace.

34. The semiconductor device assembly of claim 30, further comprising a solder wettable material coating at least part of the free, cantilevered portion.

35. The semiconductor device assembly of claim 34, further comprising a material nonwettable by a solder covering a portion of the at least one conductive trace secured to the carrier substrate.

36. The semiconductor device assembly of claim 35, wherein the carrier substrate comprises a recess located underneath the free, cantilevered portion of the at least one conductive trace.

37. The semiconductor device assembly of claim 30, wherein the free, cantilevered portion comprises a sharpened end.

38. The semiconductor device assembly of claim 30, wherein a longitudinal axis of the at least one of the plurality of compliant electrical contacts is aligned with a reference line that extends substantially radially from a center of the carrier substrate radially outward.

39. The semiconductor device assembly of claim 30, wherein the at least one of the plurality of bond pads is soldered to one of the plurality of compliant electrical contacts of the carrier substrate.

40. A semiconductor device assembly comprising:
a semiconductor substrate having a plurality of compliant electrical contacts, at least one of the plurality of compliant electrical contacts in electrical communication with a circuitry on or within the semiconductor substrate, each of the plurality of compliant electrical contacts comprising:
at least one conductive trace secured to the semiconductor substrate, the at least one conductive trace having a free, cantilevered portion, the at least one conductive trace having bonded thereto only on an upper surface thereof at least one stressed material filling an aperture within the at least one conductive trace and extending over at least part of the free, cantilevered portion and having a length less than a full length of the at least one conductive trace, the at least one stressed material exhibiting an at least partially tensile stress state sufficient to bias the free, cantilevered portion away from the semiconductor substrate; and
a carrier substrate having a surface including a plurality of terminal pads thereon, at least one of the plurality of terminal pads bonded to one of the plurality of compliant electrical contacts of the semiconductor substrate.

41. The semiconductor device assembly of claim 40, further comprising at least one insulating layer disposed between the semiconductor substrate and a portion of the at least one conductive trace secured thereto.

42. The semiconductor device assembly of claim 40, wherein the at least one stressed material comprises a first layer bonded to the at least one conductive trace exhibiting an at least partially compressive stress state and a second layer at least partially superimposed over and bonded to the first layer exhibiting an at least partially tensile stress state.

43. The semiconductor device assembly of claim 40, wherein the semiconductor substrate comprises a recess located underneath the free, cantilevered portion of the at least one conductive trace.

44. The semiconductor device assembly of claim 40, further comprising a solder wettable material coating at least part of the free, cantilevered portion.

45. The semiconductor device assembly of claim 44, further comprising a material nonwettable by a solder covering a portion of the at least one conductive trace secured to the semiconductor substrate.

46. The semiconductor device assembly of claim 45, wherein the semiconductor substrate comprises a recess located underneath the free, cantilevered portion of the at least one conductive trace.

47. The semiconductor device assembly of claim 40, wherein the free, cantilevered portion comprises a sharpened end.

48. The semiconductor device assembly of claim 40, wherein a longitudinal axis of the at least one of the plurality of compliant electrical contacts is aligned with a reference line that extends substantially radially from a center of the semiconductor substrate radially outward.

49. The semiconductor device assembly of claim 40, wherein the at least one of the plurality of terminal pads is soldered to one of the plurality of compliant electrical contacts of the semiconductor substrate.

50. A semiconductor device assembly comprising:
a probe card comprising:
a substrate having a plurality of compliant electrical contacts, each of the plurality of compliant electrical contacts comprising:
at least one conductive trace secured to the substrate, the at least one conductive trace having a free, cantilevered portion, the at least one conductive trace having bonded thereto only on an upper surface thereof at least one stressed material filling an aperture within the at least one conductive trace and extending over at least part of the free, cantilevered portion and having a length less than a full length of the at least one conductive trace, the at least one stressed material exhibiting an at least partially tensile stress state sufficient to bias the free, cantilevered portion away from the substrate; and at least one semiconductor die having an active surface including a plurality of bond pads thereon, at least some of the plurality of compliant electrical contacts of the probe card in electrical communication with respective bond pads of the at least one semiconductor die.

51. The semiconductor device assembly of claim 50, further comprising at least one insulating layer disposed between the substrate and a portion of the at least one conductive trace secured thereto.

52. The semiconductor device assembly of claim 50, wherein the at least one stressed material comprises a first layer exhibiting an at least partially compressive stress state and a second layer at least partially superimposed over and bonded to the first layer exhibiting an at least partially tensile stress state.

53. The semiconductor device assembly of claim 50, wherein the substrate comprises a recess located underneath the free, cantilevered portion of the at least one conductive trace.

54. The semiconductor device assembly of claim 50, further comprising a solder wettable material coating at least part of the free, cantilevered portion.

55. The semiconductor device assembly of claim 54, further comprising a material nonwettable by a solder covering a portion of the at least one conductive trace secured to the substrate.

56. The semiconductor device assembly of claim 55, wherein the substrate comprises a recess located underneath the free, cantilevered portion of the at least one conductive trace.

57. The semiconductor device assembly of claim 50, wherein the free, cantilevered portion comprises a sharpened end.

58. The semiconductor device assembly of claim 50, wherein the substrate comprises a semiconductor material.

59. The semiconductor device assembly of claim 50, wherein the at least one conductive trace comprises a first conductive layer and a second conductive layer disposed on the first conductive layer.

60. The semiconductor device assembly of claim 59, wherein the at least one stressed material comprises solder disposed on the second conductive layer, the solder having a coefficient of thermal expansion greater than a coefficient of thermal expansion of the second conductive layer.

61. The semiconductor device assembly of claim 50, wherein a longitudinal axis of at least one of the plurality of compliant electrical contacts is aligned with a reference line that extends substantially radially from a center of the substrate radially outward.

62. An electrical device comprising: a substrate having a plurality of compliant electrical contacts, at least one of the plurality of compliant electrical contacts in electrical communication with a circuitry on or within the substrate, each of the plurality of compliant electrical contacts comprising: at least one conductive trace secured to the substrate, the at least one conductive trace having a free, cantilevered portion, the at least one conductive trace having bonded thereto only on an upper surface thereof a solder material extending over at least part of the free, cantilevered portion and having a length less than a full length of the at least one conductive trace, the solder material exhibiting an at least partially tensile stress state sufficient to bias the free, cantilevered portion away from the substrate.

* * * * *